(12) United States Patent
Leong et al.

(10) Patent No.: US 9,698,768 B2
(45) Date of Patent: Jul. 4, 2017

(54) SYSTEM AND METHOD FOR OPERATING A SWITCHING TRANSISTOR

(71) Applicant: Infineon Technologies Austria AG, Villach (AT)

(72) Inventors: Kenneth Kin Leong, Villach (AT); Hadiuzzaman Syed, Villach (AT); Chris Notsch, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/799,168

(22) Filed: Jul. 14, 2015

(65) Prior Publication Data

US 2017/0019095 A1   Jan. 19, 2017

(51) Int. Cl.
  *H03K 17/16* (2006.01)
  *H03K 17/60* (2006.01)
  *H03K 17/687* (2006.01)

(52) U.S. Cl.
  CPC ......... *H03K 17/167* (2013.01); *H03K 17/602* (2013.01); *H03K 17/687* (2013.01)

(58) Field of Classification Search
  CPC .. H03K 17/102; H03K 17/167; H03K 17/602; H03K 17/687
  USPC ........................ 327/108, 109, 110, 111, 112
  See application file for complete search history.

(56) References Cited

U.S. PATENT DOCUMENTS

| | | |
|---|---|---|
| 6,650,169 B2 | 11/2003 | Faye et al. |
| RE40,352 E | 6/2008 | Deboy et al. |
| 7,714,624 B2 * | 5/2010 | Takasu ............. H03K 17/08142 327/110 |
| 8,299,820 B2 | 10/2012 | Deboy |
| 2002/0097071 A1 * | 7/2002 | Confalonieri .... H03K 19/00361 327/108 |
| 2014/0015592 A1 * | 1/2014 | Weis ................... H03K 17/102 327/430 |

OTHER PUBLICATIONS

Chen, Y., et al., "A Resonant MOSFET Gate Driver With Efficient Energy Recovery," IEEE Transactions on Power Electronics, vol. 19, No. 2, Mar. 2004, pp. 470-477.
Dwane, P., et al., "An Assessment of Resonant Gate Drive Techniques for use in Modern Low Power DC-DC Converters," Twentieth Annual IEEE Applied Power Electronics Conference and Exposition (APEC 2005), Mar. 6-10, 2005, vol. 3, pp. 1572-1580.
Eberle, W., et al., "A Resonant Gate Drive Circuit with Reduced MOSFET Switching and Gate Losses," IECON 2006—32nd Annual Conference on IEEE Industrial Electronics, Nov. 6-10, 2006, pp. 1745-1750.
Reusch, D., "Impact of Parasitics on Performance," White Paper: WP009, Efficient Power Conversion Corporation, Mar. 2013, 5 pgs.

(Continued)

*Primary Examiner* — John Poos
(74) *Attorney, Agent, or Firm* — Slater Matsil, LLP

(57) ABSTRACT

In accordance with an embodiment, a method of operating a switching transistor includes turning-off the switching transistor by transferring charge from a gate-drain capacitance of the switching transistor to a charge storage device, and turning-on the switching transistor by transferring charge from the charge storage device to a gate of the switching transistor. Turning off the switching transistor includes hard-switching and turning-on the switching transistor includes soft-switching.

53 Claims, 13 Drawing Sheets

(56) References Cited

OTHER PUBLICATIONS

Thapar, N., et al., "MOSFET Technology Advances DC-DC Converter Efficiency for Processor Power," International Rectifier Corporation, PCIM 2001, Sep. 2001, 5 pgs.

Ying, Y., "Device Selection Criteria—Based on Loss Modeling and Figure of Merit," Thesis submitted to the Faculty of the Virginia Polytechnic Institute and State University, Mar. 8, 2008, 114 pgs.

* cited by examiner

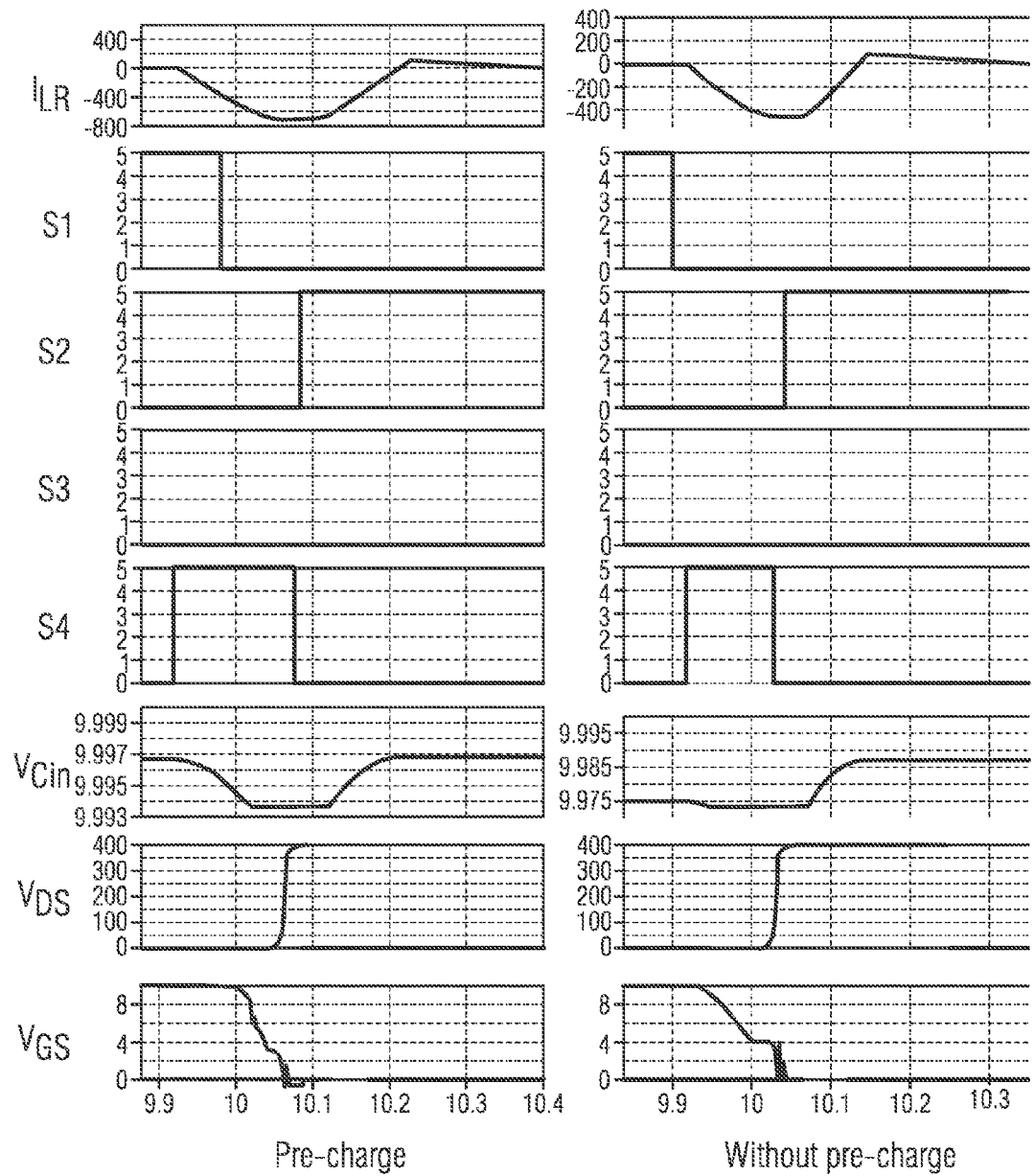

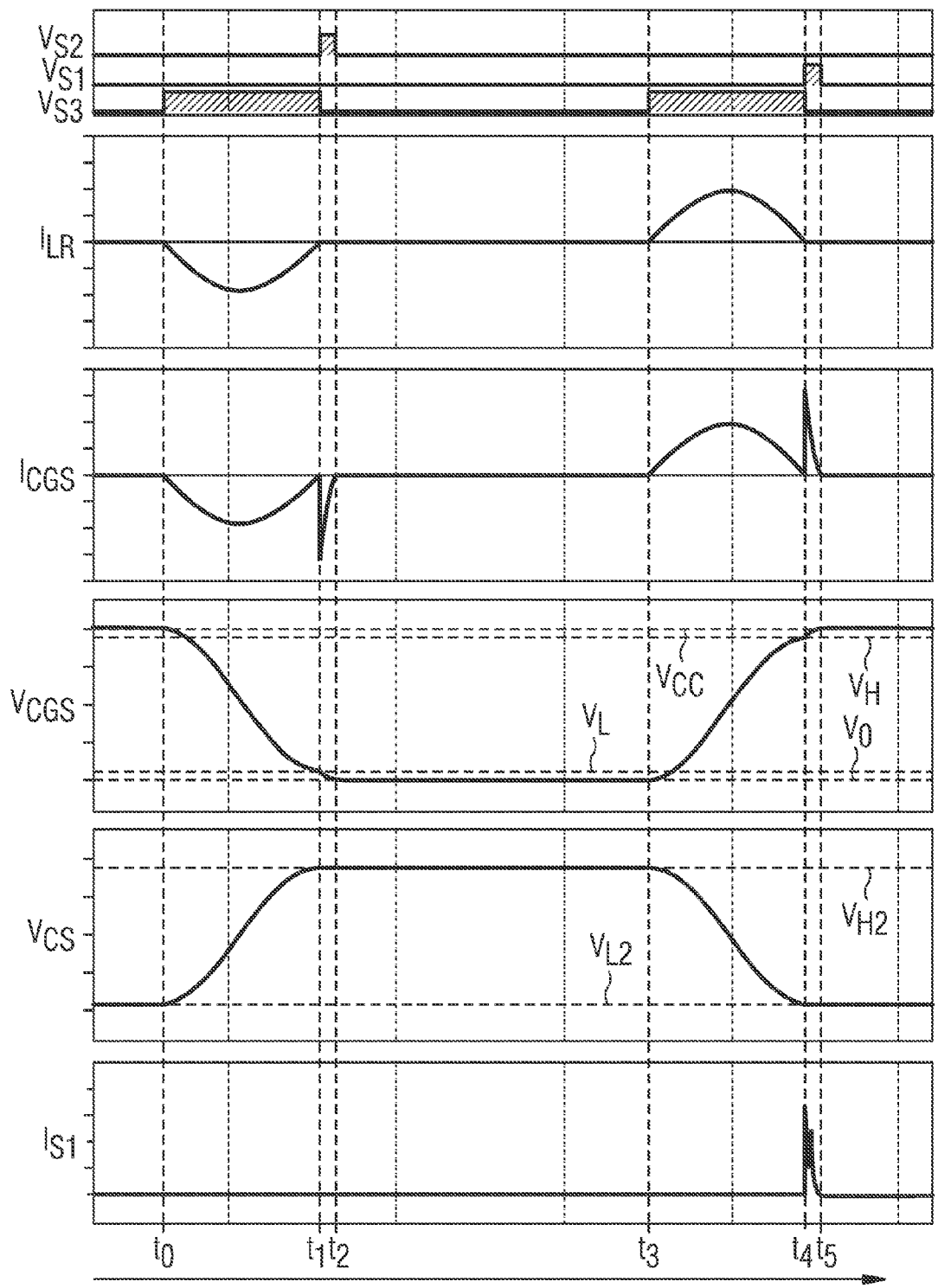

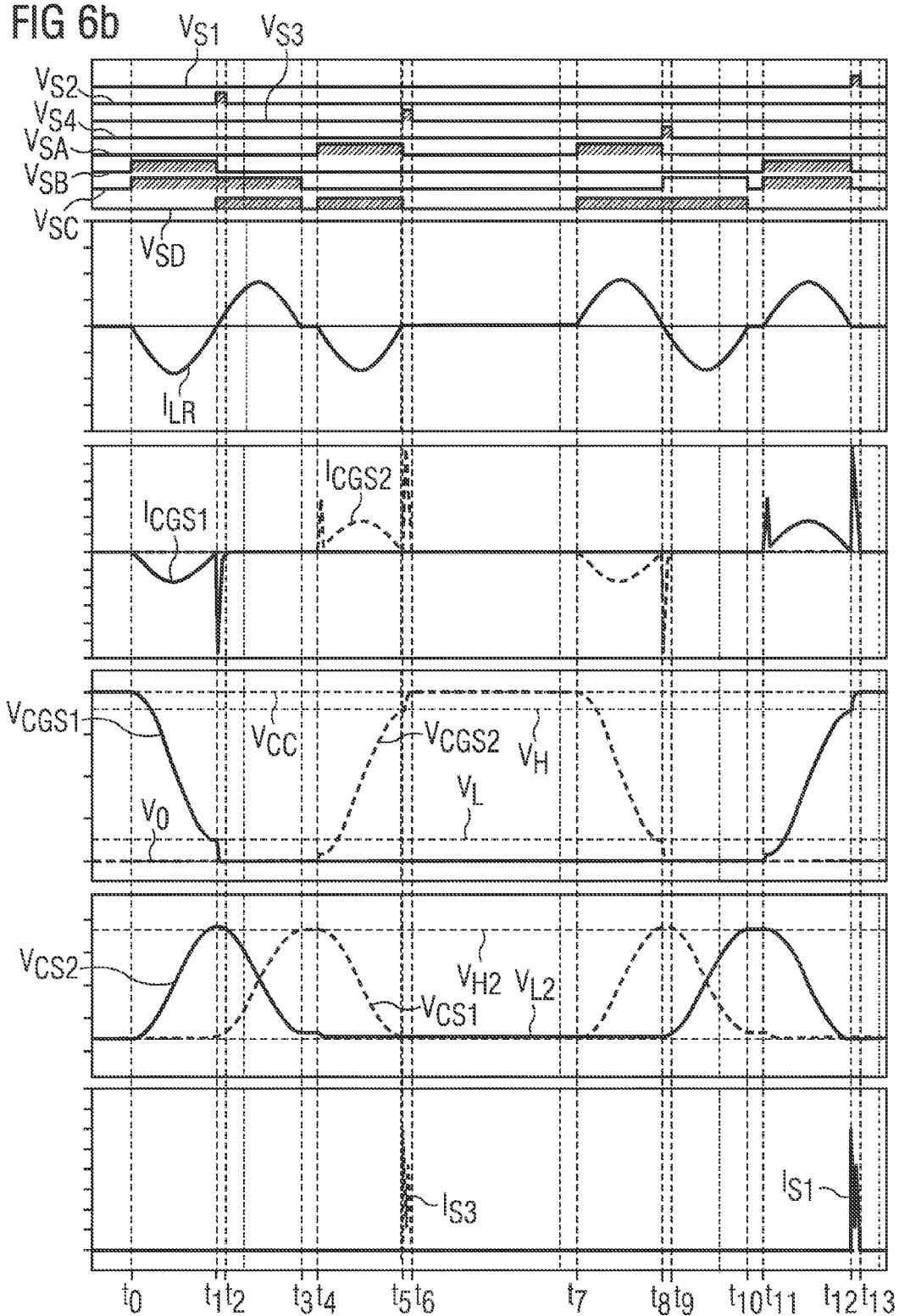

SYSTEM AND METHOD FOR OPERATING A SWITCHING TRANSISTOR

TECHNICAL FIELD

The present invention relates generally to an electronic device, and more particularly, to a system and method for operating a switching transistor.

BACKGROUND

Switched-mode circuits, including switched-mode power supplies and motor controllers, are pervasive in many electronic applications from computers to automobiles. Generally, voltages within a switched-mode power supply system are generated by performing a DC-DC, DC-AC, and/or AC-DC conversion by operating a switch coupled to an inductor or a transformer. Switched-mode power supplies are usually more efficient than other types of power conversion systems because power conversion is performed by controlled charging and discharging a low loss component, such as an inductor or transformer, thereby reducing energy lost due to power dissipation across resistive voltage drops. Similarly, switched-mode motor controllers may be used to efficiently commutate DC brushless motors with low losses in the driving circuitry.

With respect to implementing a switched-mode circuit, specialized driving circuitry is used to efficiently drive a switching transistor coupled to the various magnetic components. Such circuitry may be configured to provide switching signals at appropriate speeds and voltage levels. These voltage levels may be established, for example, by using external DC supply voltages, voltage regulators, level shifters, charge pumps and other circuits to ensure that the switching transistor is turned-on and off. Each time the driving circuitry drives the switching transistor through one switching cycle, power may be consumed due to the charging and discharging of the input capacitance of the switching transistor.

SUMMARY

In accordance with an embodiment, a method of operating a switching transistor includes turning-off the switching transistor by transferring charge from a gate-drain capacitance of the switching transistor to a charge storage device, and turning-on the switching transistor by transferring charge from the charge storage device to a gate of the switching transistor. Turning off the switching transistor includes hard-switching and turning-on the switching transistor includes soft-switching.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2a-2c illustrate a schematic of an embodiment switching transistor driving system, and associated waveform diagrams;

FIG. 5a and FIG. 5b illustrate a schematic of a further embodiment switching transistor driving system and associated waveform diagrams respectively;

FIG. 6a and FIG. 6b illustrate a schematic of a further embodiment switching transistor driving system and associated waveform diagrams respectively;

Figure 1:
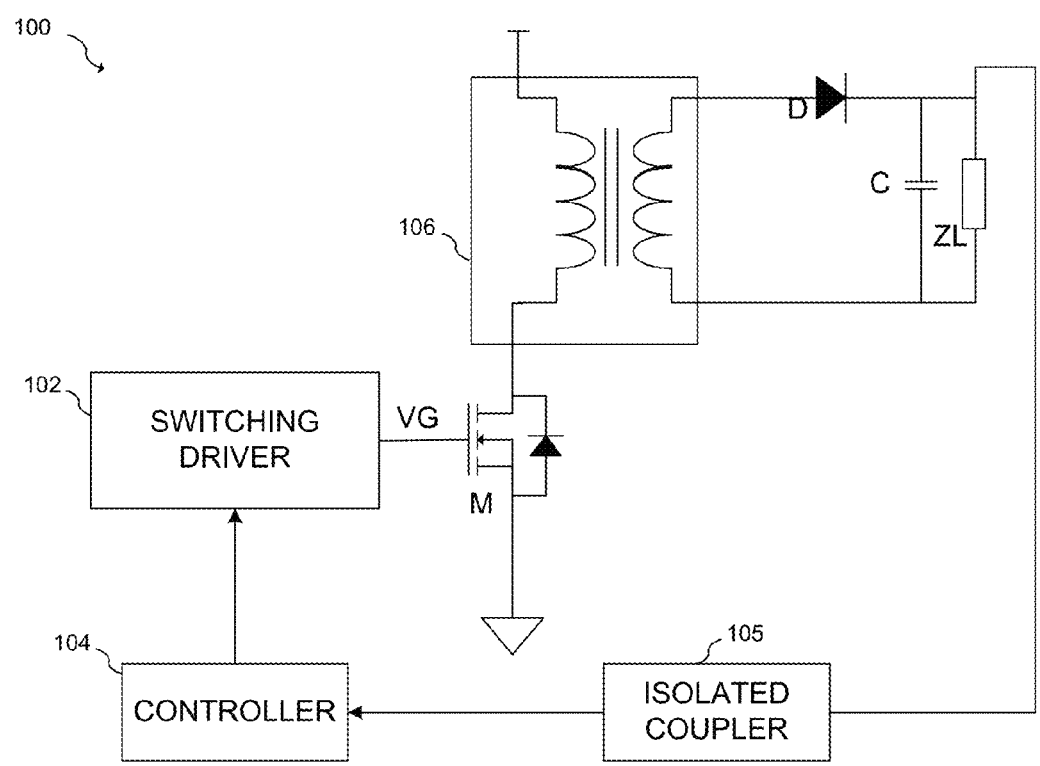
FIG. 1 illustrates a block diagram of an exemplary flyback converter.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a system and method for driving switching MOSFET and extracting energy from the switching MOSFET for further reuse. Embodiments of the present invention may also be applied to various systems that utilize switching transistors, such as switched-mode power supplies (SMPS) and various H-bridge drivers. Embodiments may also be directed toward driving capacitive gated devices such as super junction MOSFETs, IGBTs, gallium nitride (GaN) MOSFET gate-injection transistors, GaN high electron mobility transistors (HEMT).

In an embodiment of the present invention, the energy used to drive the gate or control node of a switching transistor is harvested from the gate-drain capacitance of the switching transistor itself. Accordingly, during nominal operation of the all or part of the energy used to drive the gate of the switching transistor may be obtained from charging and discharging of the switching transistor instead of or in additional to power supplied by the local power supply of the gate driver.

During operation of an embodiment gate driver, charge entering the gate-drain capacitance and/or gate-source capacitance of the switching transistor is stored as the switching transistor is being turned-off. As the gate of the switching transistor is pulled low and as the drain voltage of the switching transistor increases in voltage, current flowing from the gate-drain capacitance and/or gate-source capacitance of the switching transistor is used to magnetize an inductor coupled to the gate of the switching transistor. This energy stored in the inductor may be transferred to a capacitor or other energy storage device. When the switching transistor is turned-on again, the energy stored in the capacitor or other energy storage device is used to charge the gate of the switching transistor in order to turn it on. When a zero-voltage or valley switching scheme is used, that is, when the switching transistor is turned-on when the drain voltage is zero or a low voltage, the amount of energy harvested when the switching transistor is turned off may exceed the amount of energy needed to charge the gate-source capacitance of the switching transistor in order to turn it on. Accordingly, this harvested energy may be used to power the gate driver itself and/or other circuits.

In an embodiment of the present invention, a resonant gate driver circuit is configured to extract energy from a switching transistor, typically a MOSFET. However, the method is applicable to any capacitive gated devices. During a turn-off event of the switching transistor, energy is stored across a gate-drain capacitor while a drain node is charged. During the turn-off event, a gate voltage is discharged by connecting it to an inductor via a first switch. The energized inductor transfers its energy to a storage capacitor coupled to it. The first switch is turned-off after one-half of the resonant period to allow transfer of energy to the storage capacitor. When the gate voltage is discharged, the storage capacitor is isolated from the gate of the switching transistor via the first switch, until it is time for next turn-on event. Until the next turn-on event occurs, a second switch connected between the gate and a reference terminal of the switching transistor is activated and kept on to discharge residual charge across gate to the reference terminal. During the turn-on event, the second switch is turned-off and the first switch is turned-on. The harvested energy stored in the storage capacitor is transferred via the inductor to charge the gate of the switching transistor. The amount of time needed to transfer energy across an LC resonant tank formed by the inductor and a combination of the storage capacitor and a gate-source capacitor is controlled by the resonant period of the tank. The first switch is turned-off after one half of the resonant period of the LC resonant tank. A third switch coupled between a driver power supply and the gate node of the switching transistor is turned-on to replenish energy loss during transfer and pull the gate to the driver power supply.

FIG. 1 illustrates a block diagram of a fly back converter 100 that includes a switching transistor M coupled to a primary winding ground of transformer 106. During operation, switching transistor M is turned-on and off via a switching driver 102 and magnetizes the primary winding of transformer 106. When switching transistor M is turned-off, current induced in the secondary winding of transformer 106 charges capacitor C and provides power to a load represented by load impedance $Z_L$ via rectifying diode D. Controller 104 provides a pulse-width modulated signal to switching driver 102 and may be used to control the output voltage and/or output current for fly back converter 100. Over the course of switching transistor M on and off, power is transferred from switching driver 102 each time the gate of switching transistor M is charged. Hence, in some conventional switching drivers, the total power dissipated by switching driver 102 is proportional to the switching frequency, as well as the gate capacitance of transistor M. In some embodiments, fly back converter 100 includes isolated coupler 105 that provides a feedback signal to controller 104 based on the output voltage and/or output current of fly back converter 100. In various embodiments, an isolated coupler 105 may be implemented using an opto-coupler, magnetic transformer, capacitive coupling circuit, or other isolating coupler circuit known in the art.

Figure 2A:
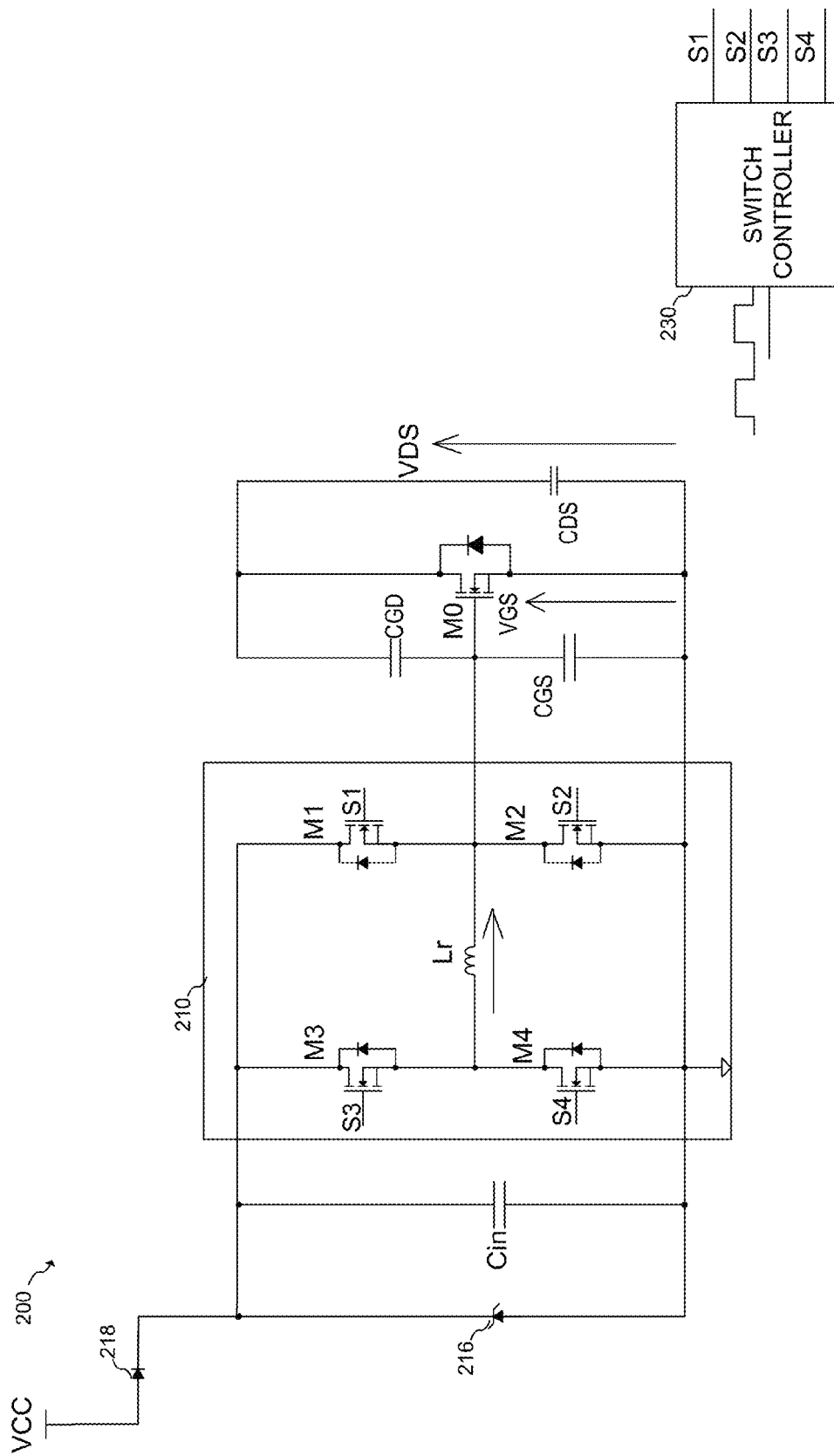

FIG. 2a illustrates an embodiment gate driving system 200 that includes a resonant gate driver circuit 210 coupled between the gate of switching transistor M0 and capacitor Cin. As shown, the resonant gate driver circuit 210 is implemented as an H-bridge circuit having switches M1, M2, M3 and M4 and inductor Lr coupled across the H-bridge circuit. Capacitors CGD, CGS and CDS coupled to switching transistor M0 represent the parasitic gate-drain, gate-source and drain-source capacitances of switching transistor M0, respectively. As shown, switches M1, M2, M3 and M4 are implemented using NMOS transistors. Alternatively, switches M1, M2, M3 and M4 may be implemented using other transistor types or other switching structures.

During operation, energy is harvested from the gate-drain capacitance CGD of switching transistor M0 and stored in capacitor Cin when switching transistor M0 is turned off using a hard switching topology, and energy is transferred from capacitor Cin to the gate of switching transistor M0 when switching transistor M0 is turned on. In some embodiments, energy may be harvested from the gate-source capacitance CGS as well.

Various types of switching topologies are used to drive switching transistors on or off in a switched mode power supply system. Two of these topologies include hard switching and soft switching. During a hard switching turn on event, a voltage equal to at least the supply voltage is applied across the transistor and current increases through the transistor. An overlap of the voltage and the current causes a power loss during a hard switching turn on. During the hard switching turn off, the current through the transistor decreases and the voltage across the output of the transistor increases. A similar overlap of voltage and current during turn off causes a switching power loss. Besides switching losses, hard switching topology is associated with electromagnetic-interference (EMI) due to high dv/dt and di/dt and device stress.

A soft switching topology is used to improve some of the issues observed in hard switching. Soft switching involves switching of the transistor after an output voltage or current reaches zero value. Soft switching may be implemented using a zero voltage switching (ZVS) topology or a zero current switching (ZCS) topology during turning on or off a transistor. Zero voltage switching is used to reduce switching loss during turn on where the gate voltage is applied after the output voltage of the transistor is brought to a minimum or zero value. A zero current switching is used during turn off and the gate voltage is discharged after the drain current of the transistor reached a minimum or zero value.

In an embodiment, switching transistor M0 is turned off by turning on transistor M4, which discharges the gate-source capacitance CGS of switching transistor M0 via inductor Lr. As switching transistor M0 is being turned off, the drain-source voltage VDS increases across switching transistor M0 and charges the gate-drain capacitance CGD. In order to prevent the gate voltage $V_{GS}$ from being pulled up via the gate-drain capacitance CGD, charge continues to be pulled from charged gate-drain capacitance CGD via inductor Lr, and inductor Lr is energized during this discharge. In some embodiments, switch M4 is closed for one-quarter of the resonant period to discharge the gate voltage. This resonant period is based on the product of inductor Lr and the gate capacitance of switching transistor M0 or any external capacitor connected across the gate and source of the switching transistor M0. Next, the switch M2 and the switch M3 are closed, thereby allowing inductor Lr to provide a charging current to capacitor Cin, while ensuring that the gate voltage of the switching transistor is held at ground. In some embodiments, switch M3 may remain open to allow the energy of the inductor to be transferred to capacitor Cin via the body diode of switch M3. It should be understood that charging current across the body diode of switch M3 when the switch remains open may result in some power loss.

The stored energy in capacitor Cin may be utilized when turning-on switching transistor M0 by closing switch M3 and opening switch M2. Accordingly, the energy stored in capacitor Cin is transferred to the gate of switching transistor M0 via inductor Lr in order to charge the gate of switching transistor M0. In some embodiments, after one-half of the resonant period, switch M3 is opened and switch M1 is closed to allow energy from the capacitor Cin to be transferred to gate-source capacitance CGS. Switch M1 also ensures that the gate of the switching transistor is held at the same voltage as Cin when switching transistor M0 is turned-on.

In some embodiments, more energy may be transferred from gate-drain capacitance CGD and gate-source capacitance CGS of the switching transistor M0 to capacitor Cin than is transferred from the capacitor Cin to the gate of switching transistor M0. Such a condition may arise, for example, when VDS during turn-on is less than the resulting VDS immediately after the switching transistor M0 is turned-off. In some embodiments, a valley switching scheme and/or zero-voltage switching schemes known in the art may be used to satisfy such a condition.

In embodiments where more energy is transferred from gate-drain capacitance CGD and gate-source capacitance CGS of switching transistor M0 to capacitor Cin than is transferred from capacitor Cin to the gate of switching transistor M0, the voltage across capacitor Cin continues to increase as the capacitor receives charge from gate-drain capacitance CGD and gate-source capacitance CGS of switching transistor M0. In order to prevent the voltage across the various circuit components from exceeding their maximum rated voltages, zener diode 216 is used to clamp the voltage across capacitor Cin. A diode 218 coupled to supply node VCC allows pre-charging of capacitor Cin during startup. In various embodiments, the zener clamp voltage of zener diode 216 is greater than VCC. In alternative embodiments, other known clamping circuits may be used.

FIG. 2*a* also illustrates a switch controller 230 for generating controlling signals for switches M1, M2, M3 and M4. The signal S1 controls the switch M1, the signal S2 controls the switch M2, the signal S3 controls switch M3, and the signal S4 controls switch M4. The control signal going high indicates a turn-on event of the switch and the control signal remaining low indicates a turn-off event of the switch. The amount of time that switches M3 and M4 are turned-on is predetermined and based on the values of inductor Lr, gate-source capacitance CGS and capacitor Cin. In the present embodiment, the switches are implemented by an n-channel MOSFET. Alternatively, other types of transistors or devices may be used, for example, a p-channel MOSFET, a BJTs, or a JFET, or other device types depending on the particular embodiment and specifications. In such alternative embodiments, the behavior of switch controller 230 may be modified to provide suitable signals to the various alternative transistor types.

In various embodiments, an energy transfer from the capacitor Cin to the gate-source capacitor CGS via the inductor Lr is used to turn on the switching transistor. The switching transistor turns on by having gate-source capacitor CGS charged thereby increasing the gate to source voltage. In an embodiment, a rate of change of voltage of a gate to source node of the switching transistor may be controlled by adjusting a value of the inductor Lr coupled to the gate of the switching transistor. A combination of the value of the inductor Lr and the gate-source capacitance CGS controls the rate of change of voltage of the gate to source node during the turn on event of the switching transistor.

FIG. 2*b* illustrates a waveform diagram showing various signals within the embodiment gate driving system 200 that shows timing information in the horizontal axis and voltage and current information in the vertical axis. The waveform labeled $V_{Cin}$ corresponds to the voltage across capacitor $C_{in}$, waveform labeled $V_{DS}$ corresponds to a voltage across a drain and a source of the transistor M0, the waveform labeled $V_{GS}$ corresponds to a gate to source voltage of the transistor M0, and the waveform labeled $I_{LR}$ corresponds to the current flowing through the inductor Lr. The waveform diagram in FIG. 2*b* also describes various currents and voltages for a pre-charge and a non-pre-charge mode of gate driving during turn-off event of the transistor M0. In a pre-charge mode driving, the inductor $L_r$ is pre-charged by having an overlap of the switch signals S2 and S3. In the non-pre-charge mode driving, there is no overlap of the switch signals S2 and S3, as shown in the waveform during transistor turn-on event. In a pre-charge mode driving, the current in the inductor is higher and higher energy is built up. Accordingly, the charging of $V_{CGS}$ is faster than non-pre-charge mode driving.

FIG. 2*b* illustrates a waveform diagram of various signals during the switching transistor M0 turn-off event for both pre-charge and non-pre-charge driving conditions. The duration of pre-charge is indicated by the overlap of the signals S1 and S4. The switching transistor M0 is initially turned-on and gate voltage $V_{GS}$ is at a level higher than gate threshold voltage. The $V_{GS}$ is held high by having signal S1 high; indicating that switch M1 is closed. Signal S4 goes high first and provides a pre-charge path for the inductor via switch M1, inductor Lr and switch M4. Pre-charging is stopped when signal S1 goes low after some time. The inductor current is supplied by the body diode of switch M2 and $V_{GS}$ goes below ground reference until signal S2 goes high. This closes the switch M2 and $V_{GS}$ is held at ground reference. The inductor current re-circulates back to Vcin via switch M2, inductor Lr and switch M3. Accordingly, voltage Vcin increases during this time. The waveforms for non-pre-charge driving shows that signal S1 and signal S4 are non-overlapping. The inductor current ILR starts building up when signal S4 goes high, thereby closing switch M4. The $V_{GS}$ is held high as the transistor is on at the beginning. The voltage $V_{GS}$ starts discharging when signal S4 goes high and it is discharged via inductor Lr to ground reference terminal. The switch M4 is opened when the signal S4 goes low and $V_{DS}$ starts switching when $V_{GS}$ falls below MOSFET gate threshold voltage. Signal S2 goes high after that and causes the inductor current to recirculate back to capacitor Cin via body diode of switch M3.

Figure 2C:
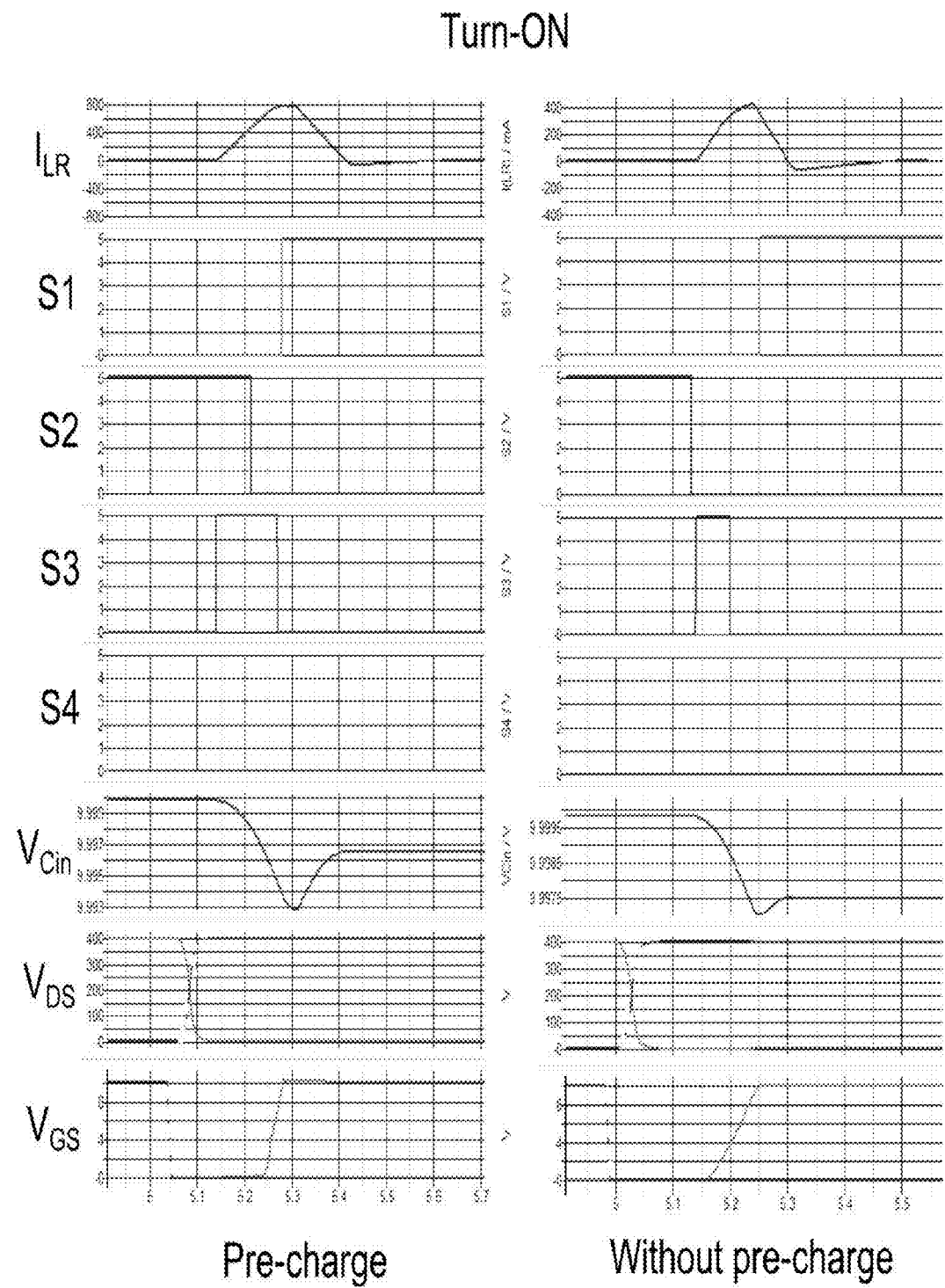

As shown in FIG. 2*c*, the inductor current $I_{LR}$ starts at zero, signal S2 is high indicating that switch M2 is closed, and signals S1, S3 and S4 are low indicating switches M1, M3 and M4 are open respectively. The voltage across capacitor Cin is denoted by Vcin and is shown at 10 V, and voltage $V_{GS}$ at the gate of the switching transistor M0 is about 0 V, indicating that the switching transistor M0 is turned-off. Next, the signal S3 goes high thereby closing switch M3. During this time, switch M2 and M3 are closed and this condition pre-charges the inductor Lr and current builds up across the inductor, as shown in the current waveform $I_{LR}$. The voltage Vcin shows a dip during this time, as the charging current is being provided by capacitor Cin. The signal S2 then goes low, indicating that switch M2 is open and that $V_{GS}$ is charged to Vcin. The signal S3 goes low indicating that switch M3 is opened, and the signal S1 goes high indicating that switch M1 is closed. This causes the excess inductor current to circulate back to capacitor Cin. This is shown by Vcin going back high after dipping low for a short while. Switch M4 remains open during this time as indicated by a low S4 signal.

As shown in FIG. 2c, the waveform with non-pre-charge driving condition indicates signals S2 and S3 are non-overlapping. The signal S2 remains high at the beginning and indicates a low $V_{GS}$ voltage at the gate of the switching transistor M0. After some time, signal S2 goes low to open switch M2 and signal S3 goes high to close switch M3. This causes the inductor to be charged as shown in current build up in the waveform $I_{LR}$. The Vcin dips during this time to indicate the energy being taken from capacitor Cin. When the signal S3 goes low and signal S1 goes high, the inductor current re-circulates through the switch M1. At this time, Vcin stops dipping. The non-pre-charge method consumes less energy than the pre-charge method in some embodiments.

Figure 3:
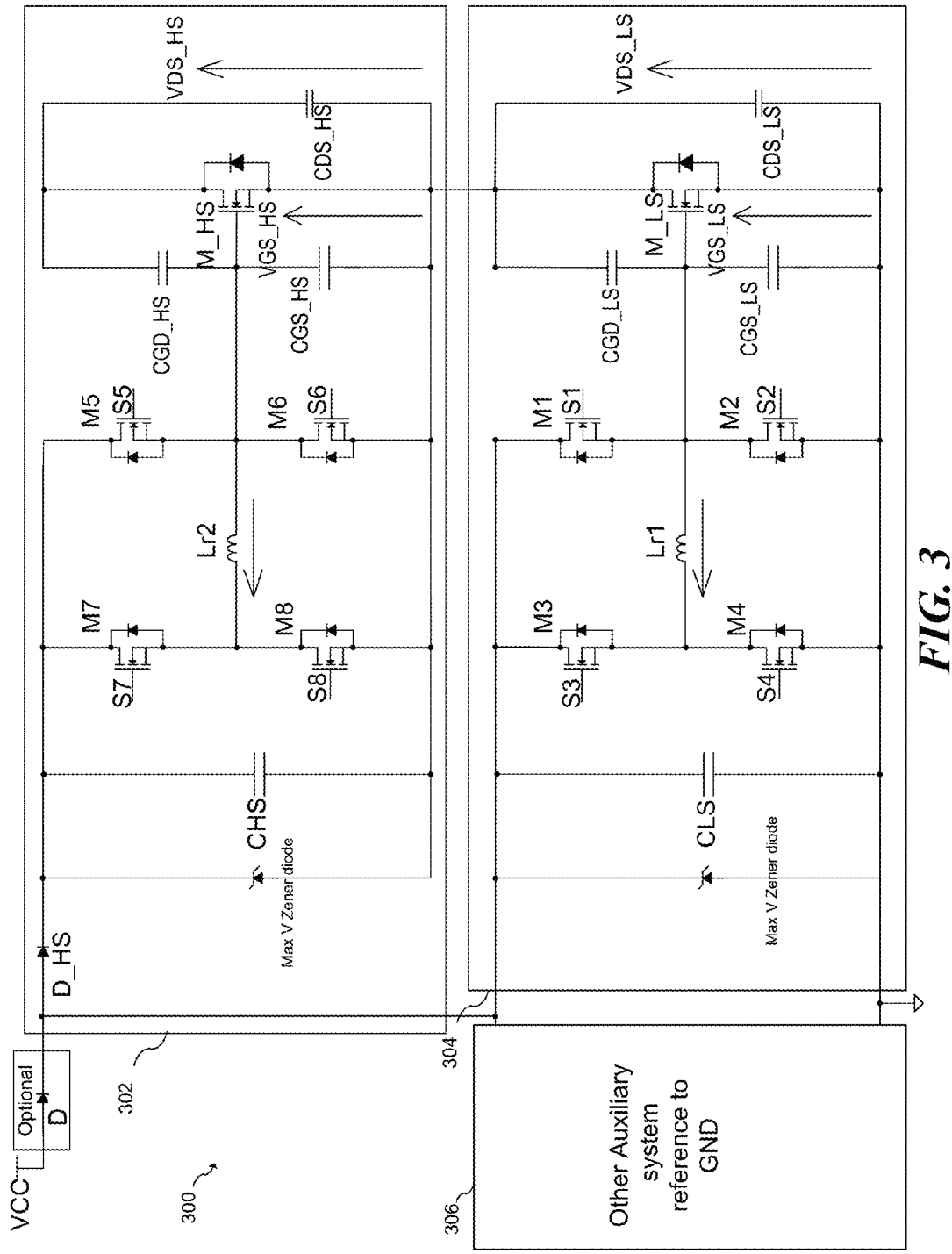
FIG. 3 illustrates a schematic of a another embodiment switching transistor driving system.

FIG. 3 illustrates another embodiment of a switching gate driver system 300 that includes a high-side gate driver 302 and a low side gate driver 304. In some embodiments, the low side gate driver 304 may also provide power to an auxiliary system 306 referenced to ground. The low side gate driver 304 is similar to switching gate driving system 200 illustrated in FIG. 2a, and includes a storage capacitor CLS to store energy harvested from a switching transistor M_LS. A resonant inductor Lr1 is used to transfer energy from the storage capacitor CLS to the gate of the switching transistor M_LS in a manner similar to that is described above with respect to FIGS. 2a to 2c.

The high-side gate driver 302 is similar to the low side driver 304 and includes a storage capacitor CHS coupled between a driver power supply and a source of the switching transistor M_HS. An inductor Lr2 is used to transfer energy from the storage capacitor CHS to the gate of the switching transistor M_HS. A diode D_HS is used as bootstrap diode to provide power to the high side gate drivers. Similarly, an optional diode D is connected in series with the power supply VCC to block current flow to the supply during energy harvesting in the low side driver.

The embodiment switching gate driver system 300 shown in FIG. 3 may be used to provide switching for systems that utilize both high-side and low side switches such as power supplies and motor controllers. In some embodiments, an auxiliary circuit represents circuitry that may be locally powered by energy harvested from the gain-drain capacitance CGD_LS of the low-side transistor M_LS. Examples of such circuitry may include, for example, other circuits and systems that support switching gate driver system 300, such as controllers, bias circuitry, PWM generators, and the like. In some embodiments, switching gate driver system 300 may be used to provide power to an isolated portion of a system, such as the primary side of a switched mode power supply having a secondary side controller.

Figure 4:
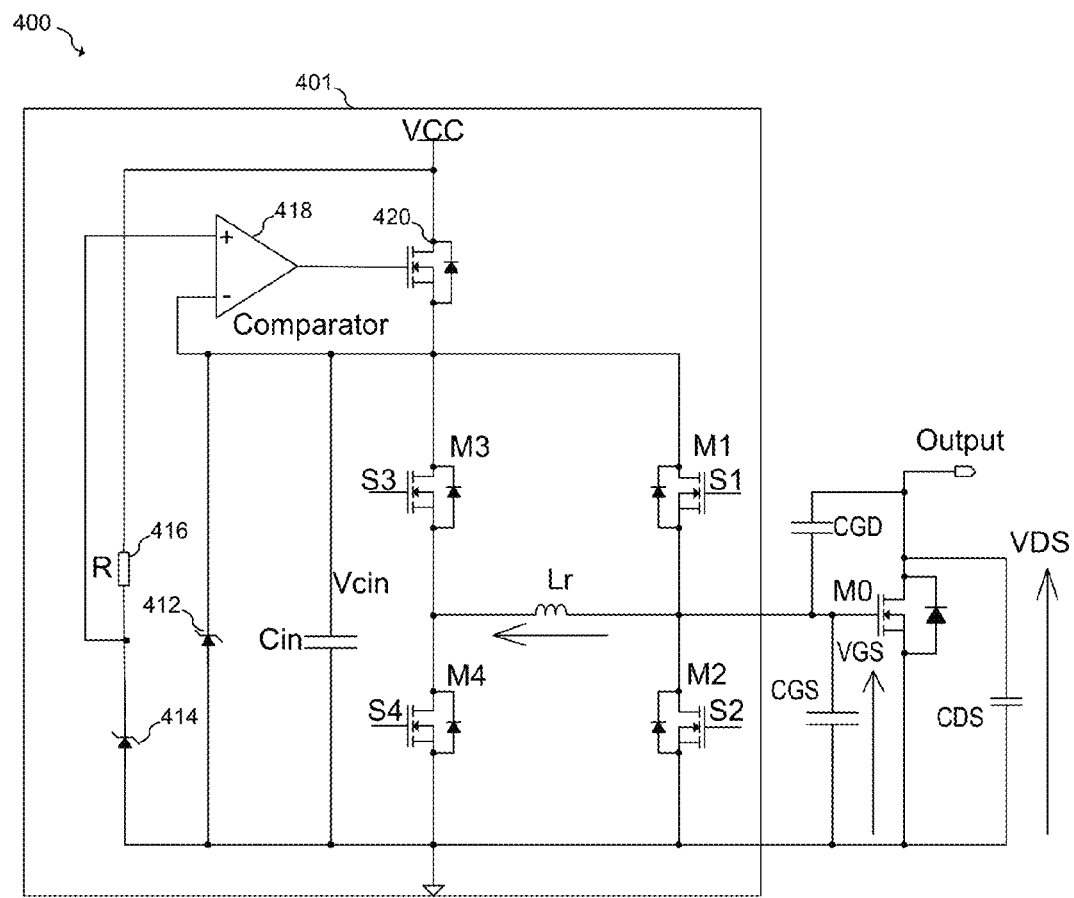
FIG. 4 illustrates a schematic of another embodiment switching transistor driving system.
Figure 4:
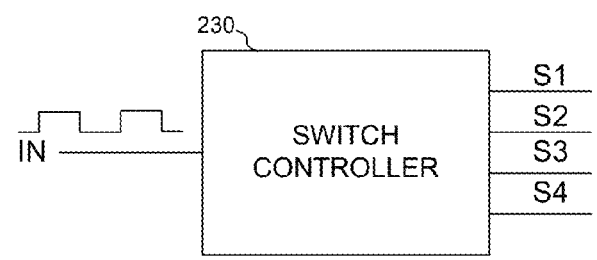

FIG. 4 illustrates a further embodiment of the switching gate driver system 400 that includes a gate driver circuit 401 coupled to a gate of switching transistor M0. The structure of the gate driver circuit 401 is similar to the structure of the gate driver shown in FIG. 2a, with the exception of an interface between the H-bridge circuit and a power supply VCC. As shown in FIG. 4, the driver power supply is coupled to the power supply VCC via a pass switch 420. This pass switch 420 is controlled by a comparator 418, which functions as a charge storage monitoring circuit and compares voltage at capacitor Cin to a minimum reference voltage. In some embodiments, the minimum reference voltage is generated by a resistor 416 and a zener diode 414. When the voltage across the capacitor Cin falls below the voltage level set by zener diode 414, comparator 418 turns-on pass switch 420 and the voltage across capacitor Cin is pulled to the power supply VCC. In alternative embodiments, the minimum reference voltage may be generated using many different methods such as using external voltage source or a voltage divider, or an on-chip voltage reference. During energy extraction, voltage at capacitor Cin continues to increase when the harvested energy exceeds the energy dissipated by the gate driver 401. Accordingly, zener diode 412, which is coupled in parallel to capacitor Cin, is used to clamp the voltage across capacitor Cin such that extra energy is dissipated across zener diode 412.

Figure 5A:
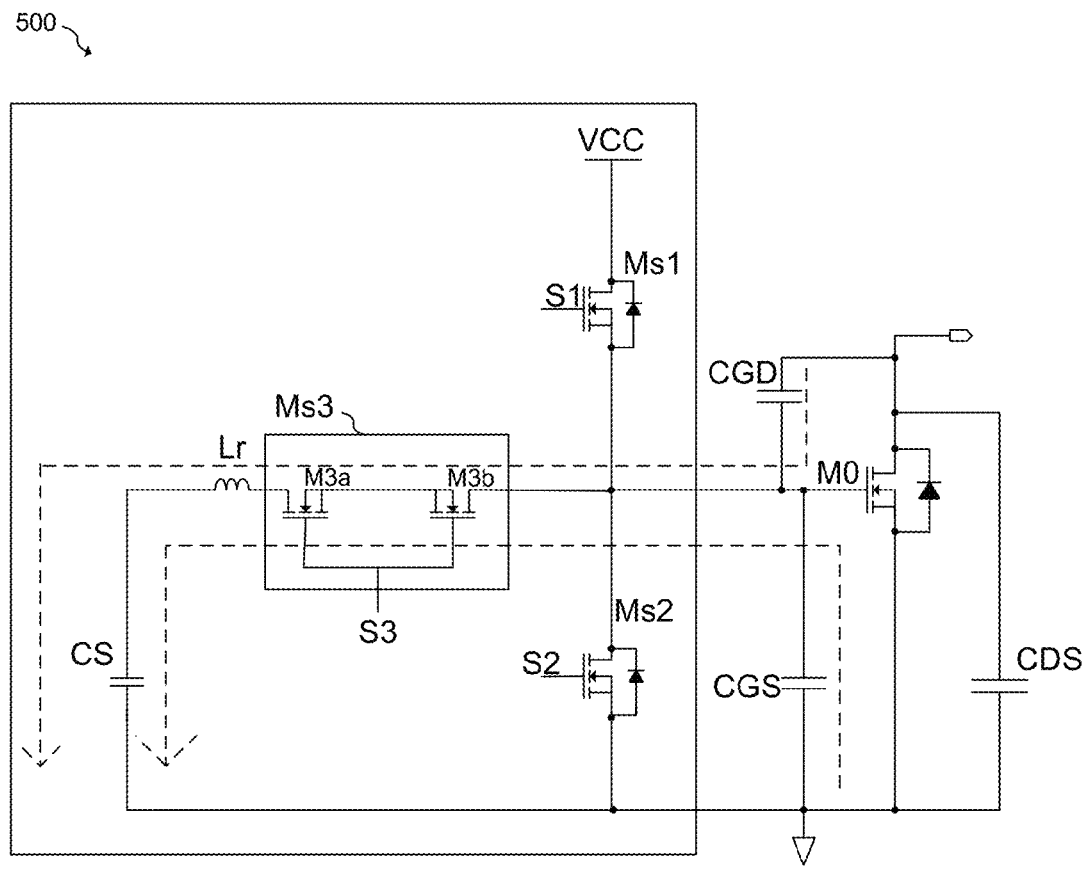
Figure 5A:
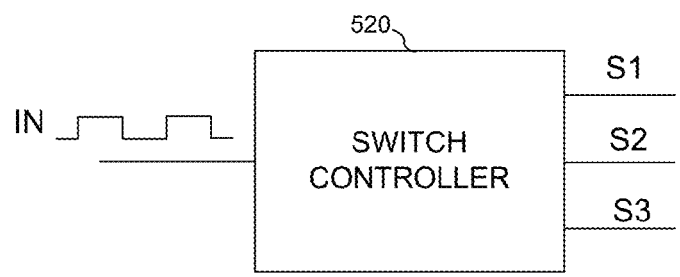

FIG. 5a illustrates another embodiment switching gate driver system 500 that is configured to drive a gate of a switching transistor M0 with a resonant inductor Lr and a combination of a storage capacitor CS and a gate-source capacitor CGS. The resonant inductor Lr is coupled to the gate of the switching transistor M0 via a switch Ms3, as well as to the storage capacitor CS to form a resonant LC tank when switch Ms3 is closed. As shown, the gate driver system 500 includes a switch Ms1 that is used to pull the gate of the switching transistor M0 to a driver supply voltage Vcc to turn-on switching transistor M0. It also includes a switch Ms2 to pull the gate of the switching transistor M0 to a reference voltage to turn-off switching transistor M0. In some embodiments, by selectively activating and deactivating the resonant condition of the LC tank, the gate of the switching transistor M0 can be pulled high or low to turn it on or off. In various embodiments, resonant inductor Lr may be implemented using discrete and/or integrated inductors and storage capacitor CS may be implemented using discrete and/or integrated capacitors. In further embodiments, additional capacitance may be coupled in parallel with gate-source capacitance CGS of switching transistor M0.

In an embodiment, switch Ms3 is implemented using a series combination of n-channel MOSFETs M3a and M3b having their body diodes facing in opposite directions. Switches Ms1, Ms2 and Ms3 are implemented using n-channel MOSFETs. Alternatively, other types of transistors or devices may be used, for example, p-channel MOSFETs, BJTs or JFETs, or other device types depending on the particular embodiment and its specifications.

As shown in FIG. 5a, a switching signal generator 520 produces switching signals S1, S2 and S3 that drive switches Ms1, Ms2 and Ms3, respectively. A high-level signal for S1 indicates a closing of switch Ms1 and a low-level signal for S1 indicates an opening of switch Ms1. This is true for signals S2 and S3 controlling switches Ms2 and Ms3 respectively. Alternatively, switching signals S1, S2, and S3 may be active low, for example, in embodiments that utilize p-channel MOSFETs for H-bridge switching transistors.

Switching transistor M0 is first turned-on by closing switch Ms1 while the switch Ms2 and the switch Ms3 remain open. The switch Ms1 pulls the gate voltage of the switching transistor M0 to the driver power supply Vcc, thereby turning it on.

Next, the switching transistor M0 is turned-off by opening the switch Ms1 and by closing switch Ms3 to activate an LC tank formed by an inductor Lr and a combination of storage capacitor CS and the capacitance seen at the gate of switching transistor M0. Energy stored in gate-source capacitance CGS and gate-drain capacitance CGD during the turn-off of switching transistor M0 is harvested by transferring energy from the input capacitance of switching transistor M0 to storage capacitor CS via inductor Lr and switch Ms3. In some embodiments, switch Ms3 is turned-on for one-half of a resonant period of the resonant LC tank formed by inductor Lr and the capacitance at the gate of the switching transistor M0. During this period, the energy is transferred and transfer stops when the switch Ms3 is opened. Subsequent to this period, the gate voltage of the switching transistor M0 may further be discharged by closing switch Ms2.

In order to turn-on switching transistor M0, switch Ms3 is again turned-on to transfer charge from storage capacitor CS to the gate of switching transistor M0. After one-half of a resonant period, switch Ms3 is opened and switch Ms1 is closed to provide additional charge to pull the gate of the switching transistor M0 to driver power supply Vcc. As switching transistor M0 is turned on, the energy extracted from gate-drain capacitance GGD during turn-off and stored in storage capacitor CS is reused.

In embodiments, a net positive energy may be harvested by turning-on the switching transistor M0 at a voltage that is less than a final settling voltage of the transistor, for example, using valley switching and/or zero voltage switching (ZVS). In some embodiments, ZVS and/or valley switching is performed by ensuring that the drain node of the switching transistor M0 is below a particular voltage and/or has reach a local minimum when transistor M0 is turned-on. In other embodiments, the switching transistor M0 is turned-on after the voltage across the output of the switching transistor M0 is below a predetermined threshold.

In another embodiment, the switching transistor is turned-on under ZVS and/or valley switching conditions, there may be enough excess energy stored in storage capacitor CS when switching transistor M0 is turned-off, that this excess energy may be used to power other portions of the driver system. This may occur when the voltage of CGS is higher than the sum of VCC and the forward voltage of the body diode of the transistor used to implement the switch Ms1, after storage capacitor CS has transferred its extracted energy during turn on. In this case, the excess energy is transferred to an energy storage (not shown) coupled to VCC. In some embodiments, switching gate driver system 500 may not need its own power supply after the first charging of the gate of the switching driver is complete.

FIG. 5b illustrates a waveform diagram showing various signals within embodiment switching gate driving system 500 with a timing information in the horizontal axis and voltage and current information in the vertical axis. The waveform labeled $V_{S1}$, $V_{S2}$, and $V_{S3}$ correspond to the switch control signals for switches Ms1, Ms2 and Ms3 respectively, the waveform labeled IS1 corresponds to current going through switch Ms1, the waveform labeled $I_{LR}$ corresponds to current going through inductor Lr, the waveform labeled $I_{CGS}$ corresponds to current through gate-drain capacitance of the switching transistor M0, the waveform labeled $V_{CGS}$ corresponds to voltage at the gate of transistor M0, and $V_{cs}$ corresponds to voltage across storage capacitor CS.

As shown in FIG. 5b, it is assumed that before time $t_0$, the switching transistor M0 is fully turned-on by having the gate voltage pulled to driver power supply Vcc. At time $t_0$, the switch Ms3 is closed and resonant condition due to gate-source capacitance CGS, inductor Lr, and storage capacitor CS is established. This initiates energy transfer from gate-source capacitance CGS to storage capacitor CS by charging the inductor Lr. The switch Ms3 is closed for one-half of a resonant cycle to allow inductor Lr to magnetize as shown in FIG. 5b. The period between $t_0$ and $t_1$ is determined by values of gate-source capacitance CGS of switching transistor M0, storage capacitor CS and inductor Lr according to:

$$t_1 - t_0 = 2\pi \frac{\sqrt{L_R \frac{1}{\left(\frac{1}{CS} + \frac{1}{CGS}\right)}}}{2}, \qquad 1$$

where $L_R$ is the inductor, CS is the storage capacitor and CGS is the capacitance of gate-source of the switching transistor M0.

At time $t_1$, switch Ms3 is opened and switch Ms2 is closed, and $V_{CGS}$ is pulled to the reference voltage $V_0$. In some embodiments, the time between $t_1$ and $t_2$ is selected to ensure the gate voltage discharges to the reference voltage $V_0$, which may be ground, for example. This discharge is shown by the current $I_{CGS}$ in the waveform diagram. Switch Ms2 is opened at time $t_2$, which isolates the energy stored in the storage capacitor CS. All of the switches are kept open until time $t_3$, when it is time to turn-on switching transistor M0. At time $t_3$, switch Ms3 is closed and the resonant circuit is formed again, thereby initiating energy transfer from storage capacitor CS to gate-source capacitance CGS by charging the inductor Lr. The switch is kept closed until time $t_4$ to ensure energy transfer between storage capacitor CS and the gate of switching transistor M0. In some embodiments, the time from $t_3$ to $t_4$ is one-half of a resonant period as described by Equation 1. The resonant current building up in the inductor Lr is shown as a positive half sine wave in the waveform $I_{LR}$. During the time period from $t_3$ to $t_4$, the voltage across the storage capacitor CS is discharged from a higher value of $V_{H2}$ to a lower value of $V_{L2}$ and the voltage across gate-source capacitance CGS increases from a reference voltage $V_0$ to a higher value $V_H$.

In some embodiments, the voltage of gate-source capacitance CGS may not fully increase to Vcc due to energy loss during the energy transfer process. At time $t_4$, the switch Ms3 is opened and the switch Ms1 is closed, and the gate voltage $V_{CGS}$ is pulled from $V_H$ to Vcc via switch Ms1. The time between $t_4$ and $t_5$ may be long enough to fully charge $V_{CGS}$ from $V_H$ to Vcc. The period between $t_4$ and $t_5$ is the time when energy is used from Vcc. This energy is very small when $V_H$ is very close to Vcc. The positive spike in current $I_{S1}$ and $I_{CGS}$ are an indication of energy used from Vcc. The switch Ms1 is opened after time $t_5$, however, in some embodiments this switch can be kept on for a longer period to avoid accidental turn-off of the switching transistor M0. The cycle is repeated when the switch Ms3 is closed to transfer energy from gate-source capacitance CGS and gate-drain capacitance CGS of switching transistor M0.

Figure 6A:
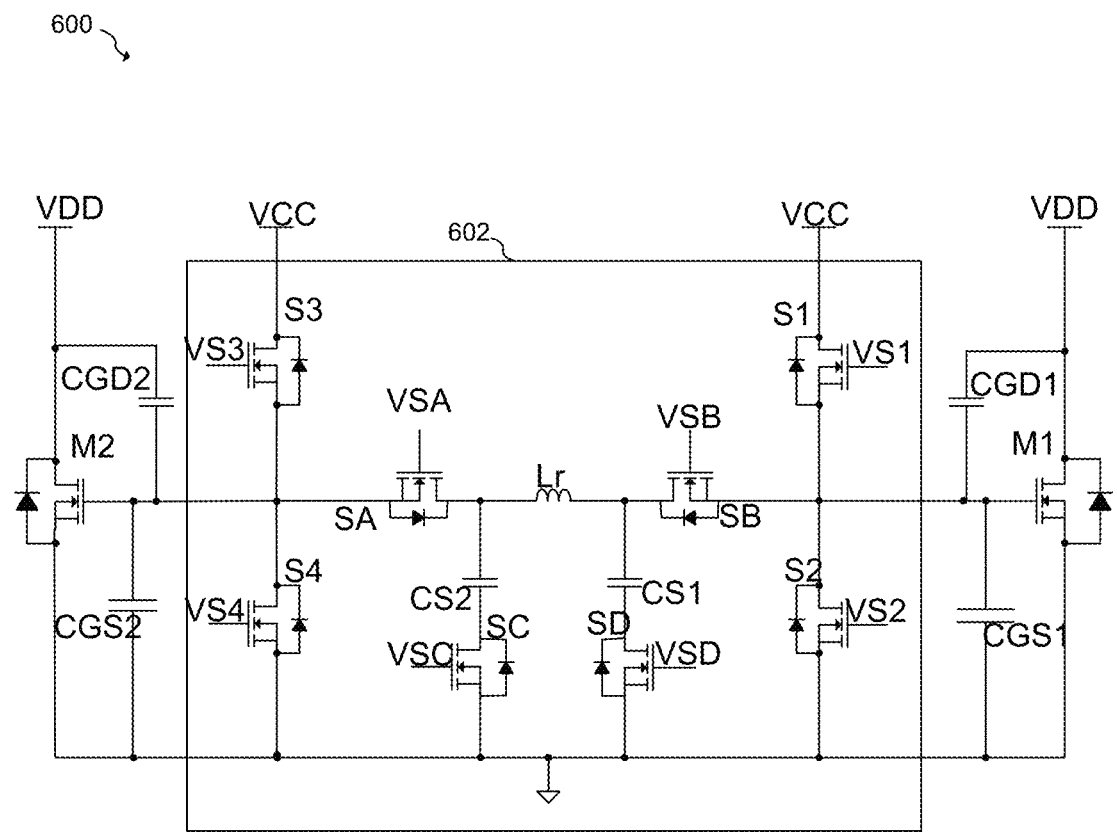
Figure 6A:
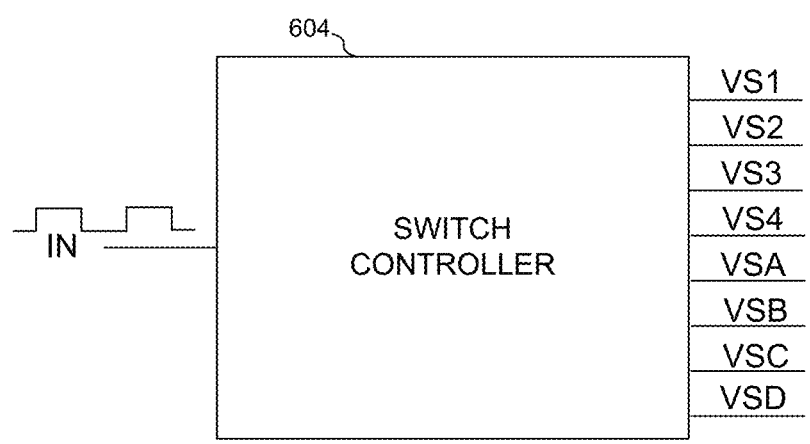

FIG. 6a illustrates another embodiment system 600 that includes a gate driver 602 that is configured to drive alternatively between two switching transistors M1 and M2 that share a common reference voltage supply. In an embodiment, inductor Lr is coupled to the gate control node of M1 and M2 via independent switches SB and SA respectively. System 600 further includes a gate pull up switch S1 coupled between a supply VCC and the gate control node of M1, and a gate pull down switch S2, coupled between the control node of M1 and a reference voltage supply. A switch S3 is used to pull up the gate of switching transistor M2, and switch S4 is used to pull-down the gate of switching transistor M2. The inductor Lr has two capacitors CS1 and CS2 connected to its opposite end. These two capacitors CS1 and CS2 may be connected or disconnected from the reference supply by two independent switches SD and SC respectively. A capacitance CGD1 represents the parasitic capacitor between the gate and the drain of transistor M1, and a capacitance CGS1 represents the parasitic capacitor between the gate and the source of transistor M1. Similarly, a capacitance CGD2 represents a parasitic capacitor between the gate and the drain of the switching transistor M2, and a capacitor CGS2 represents a parasitic capacitor between the gate and the source of the switching transistor M2.

During operation, system 600 transfers charge back and forth between the gates of transistors M1 and M2 via the inductor Lr and a series of switches. This is done by energizing the inductor Lr and storing energy across one of the two capacitors CS1 and CS2 connected at each end of the inductor Lr. The switches SA and SB control the direction of the energy transfer to and from the gates of the two switching transistors M1 and M2. The switches SC and SD control the energy storage in capacitors CS2 and CS2 respectively. The switches SC and SD are connected to the bottom plates of the capacitors CS2 and CS1 respectively to select the corresponding capacitor in which the energy is being stored. Switches S2 and S4 are connected to the gates switching transistor M1 and M2 respectively and they are used to ensure discharge of any residual charges left over after energy transfer via resonant action. The switches SA and SB are coupled to the inductor Lr in a direction such that their body diodes prevent inductor Lr from being energized when one of the switching transistors M1 and M2 is being turned off and the other is turned on. In other words, it prevents stored energy from the storage capacitors being depleted unintentionally during gate switching.

FIG. 6a also illustrates an embodiment switch controller 604 that may be used to generate control signals used to drive switches SA, SB, SC, SD, S1, S2, S3 and S4 for embodiment system 600. As shown, signal $V_{S1}$ controls the gate control node of switch S1, signal $V_{S2}$ controls switch S2, signal $V_{S3}$ controls switch S3, signal $V_{S4}$ controls the switch S4, signal $V_{SA}$ controls switch SA, signal $V_{SB}$ controls switch SB, signal $V_{SC}$ controls switch SC, and signal $V_{SD}$ controls switch SD. A high switch control signal from switch controller 604, indicates an on switch condition, and a low switch control signal indicates an off switch condition.

FIG. 6b illustrates a waveform diagram showing various signals within embodiment system 600. Timing information is shown in the horizontal axis and voltage and current is shown in the vertical axis. Before time $t_0$, it is assumed that all switches are turned off and the switching transistor M1 is turned on by having its gate voltage $V_{CGS1}$ at a supply voltage Vcc. At time $t_0$, signals $V_{SB}$ and $V_{SC}$ go high, thus turn on the switches SB and SC. The switch SC connects the bottom plate of the capacitor CS2 to reference supply voltage common to switching transistors M1 and M2. The turning on of switch SB creates a resonant LC tank formed by inductor Lr, capacitor CS2 and capacitor CGS1. The energy from capacitor CGS1 is then transferred to capacitor CS2 via inductor Lr. The switch SB and SC are kept on for one-half of the resonant period. The resonant current in the inductor $I_{LR}$ is shown in the waveform that follows a negative half sine wave. The voltage $V_{CGS1}$ at the gate terminal of switching transistor M1 is discharged and reaches to a lower value of $V_L$ from a higher value of $V_H$. At the same time, the voltage at the storage capacitor CS1, labeled $V_{cs1}$ in the waveform, starts building. At time $t_1$, switch SB is turned off at time $t_1$ to stop the resonant current from transferring energy back to the capacitor CGS1 and the switches SD and S2 are turned on. The switch S2 is turned on to discharge the gate voltage $V_{CGS1}$ to the reference voltage from its lower value of $V_L$. The switch S2 remains turned on until time $t_2$. Alternatively, the switch S2 may be kept on until time $t_{10}$ in order to ensure the $V_{CGS1}$ remains off.

As shown in FIG. 6b, the switch SD connects the bottom plate of capacitor CS1 to the reference voltage terminal such that an LC resonant tank is formed between inductor Lr, capacitor CS1 and capacitor CS2, when switch SD is turned on. Switches SC and SD are kept on for one-half of the resonant period to transfer the energy stored in capacitor CS2 to be transferred to the capacitor CS1. The transfer ends at time $t_3$ when switches SC and SD are turned off. Between time $t_3$ and $t_4$, all the switches are turned off and capacitor CS1 stores all the energy. The time interval between $t_3$ and $t_4$ is controlled by the dead time requirement between switching transistors M1 and M2 or specific converter requirement. At time $t_4$, switches SA and SD are turned on, thereby coupling inductor Lr to the gate control node of switching transistor M2 and connecting the bottom plate of capacitor CS1 to the reference terminal. Thus, a resonance condition occurs using the components CS1, Lr and CGS2.

A charge transfer from capacitor CS1 to the capacitor CGS2 takes place, as shown by a half sine wave of current in $I_{LR}$. The switch SA is turned on to allow inductor current to decay to zero at $t_5$ when it is turned off. The time period between $t_4$ and $t_5$, is one-half of the resonant period and the gate voltage VCGS2 goes from a lower value of $V_0$ to a higher value of $V_H$. At the same time, the voltage at capacitor CS1 goes from a higher value of $V_{H2}$ to a lower value of $V_{L2}$. The voltage at capacitor CGS2 reaches from its lowest value $V_0$ to a higher value $V_H$. Switch S3 is turned on at $t_5$ to pull the VCGS2 to VCC and may remain on for a time interval between $t_5$ and $t_6$, or switch S3 may remain on until time $t_7$, depending on the dead time between the activation of switching transistors M1 and M2 or according to the particular requirements of the system.

As shown in FIG. 6b, all switches are turned-off during the interval $t_6$ and $t_7$. At time $t_7$, the energy transfer is initiated from capacitor CGS2 to capacitor CS1. This is done by turning on switches SA and SD. The activation of switch SD couples the bottom plate of capacitor CS1 to the reference terminal and activation of the switch SA forms a resonant tank between capacitor CGS2, inductor Lr and capacitor CS1. Switch SA is kept on for one-half of the resonant period to allow energy transfer from capacitor CGS2 to capacitor CS1, and at time $t_8$, the switch SA is turned off. The resonant current ILR is shown by a positive half sine wave and current through capacitor CGS2 as negative. The switches SB and SA block the charging of CS2 and CGS1 respectively. During the time period between t7 and $t_8$, the VCGS2 swings from Vcc to a lower value $V_L$ and at the same time voltage VCS1 swings from a lower value $V_{L2}$ to a higher value $V_{H2}$, thus ensuring energy transfer from CGS2 to CS1. At time $t_8$, the switch SA is turned off and switches S4 and SC are turned on. Switch SA prevents charge transfer back from capacitor CS1 to capacitor CGS2. Switch S4 short circuits capacitor CGS2 to the reference terminal to ensure that VCGS2 reaches ground potential from its lower value of $V_L$. By turning on switch SC and turning off switches SA and SB, a resonant circuit is formed between capacitor CS1, inductor Lr and capacitor CS2 such that resonant current flowing through ILR transfers energy from capacitor CS1 to capacitor CS2. This energy transfer ends at time $t_{10}$, when the energy is transferred to CS2 and voltage VCS2 has attained voltage $V_{H2}$. At time $t_{10}$, all of the switches are turned off such that no current flows through the inductor as shown inductor current waveform ILR and the switches remain off until $t_{11}$. In an embodiment, time interval period between $t_{11}$ and $t_{10}$ is adjusted depending on a dead time requirement between switching transistors M1 and M2 and/or in accordance with the requirements of the particular system.

At time $t_{11}$, switches SB and SC are turned on to form a resonant tank between capacitor CS2, inductor Lr and capacitor CGS1. The energy from capacitor CS2 is then transferred to capacitor CGS1 through the inductor Lr. The inductor current $I_{LR}$ thus follows a positive half sine wave, the voltage at VCGS1 goes from a lower voltage $V_L$ to a higher voltage $V_H$ at time $t_{12}$, and the voltage at storage capacitor CS2 swings from $V_{H2}$ to $V_{L2}$. The switches SB and SC are turned-off at $t_{12}$, and at the same time switch S1 is turned-on to pull VCGS1 from $V_H$ to Vcc. The switch S1 may be turned-off at $t_{13}$ or kept on until $t_7$. A further cycle of alternative charging repeats after $t_{13}$. In some embodiments, switches S1 and S3 are turned on for short duration in order to pull the gate voltage of switching transistors M1 and M2 from $V_{H\ to}$ Vcc.

Figure 7A:
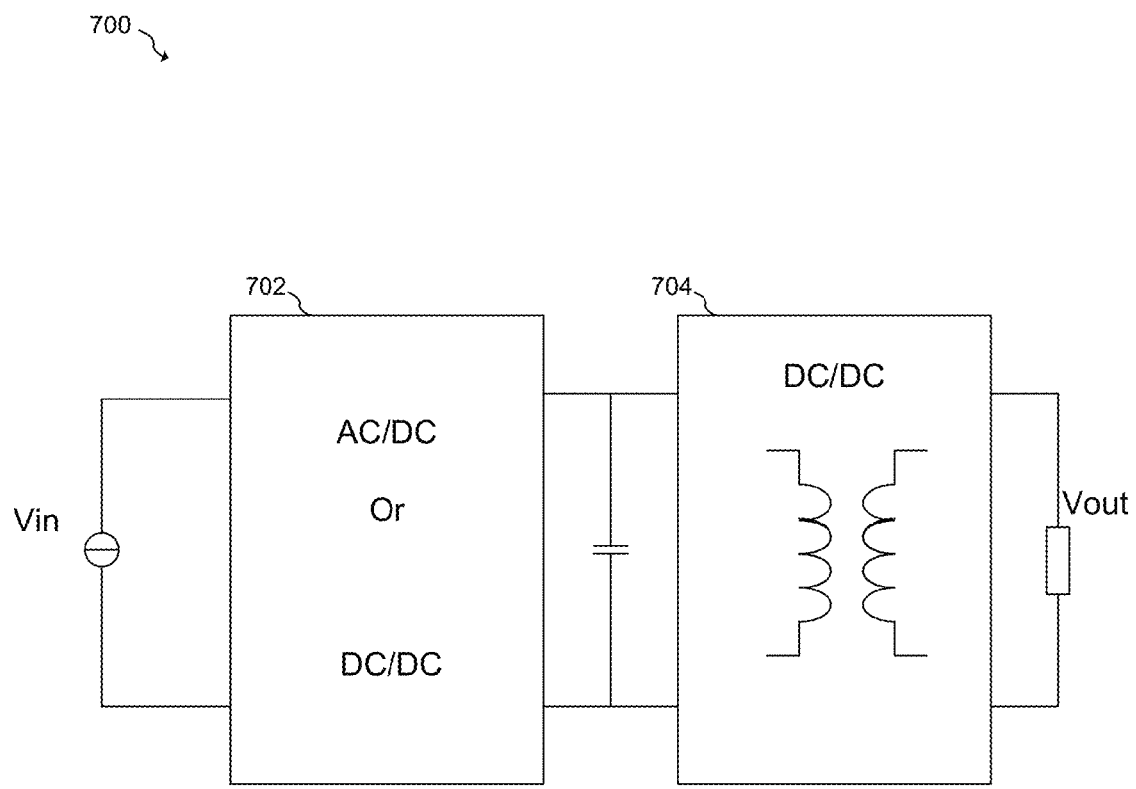
FIGS. 7a, 7b and 7c illustrate further systems that utilize switching transistor driving systems.

FIG. 7a illustrates an embodiment converter system 700 that utilizes an embodiment switching gate driver system 600 described above. The converter system 700 includes a first stage power converter 702 followed by a second stage power converter 704. In an embodiment, first stage power converter 702 may be a switched-mode AC/DC converter configured to be coupled to an AC power grid and configured to provide power factor correction (PFC). The second stage power converter 704 may be a switched DC/DC converter that converts the DC output of the first stage power converter 702 to a different DC voltage. In one example, the power converter 702 may be a switched-mode power converter that converts an AC line voltage up to about 400 Vdc, and second stage power converter 704 may convert the output of first stage power converter 702 to a lower voltage such as 12 V in order to supply power to an electronic system such as a computer. Alternatively, first stage power converter 702 may be a DC/DC converter and/or other voltages may be used.

In an embodiment, embodiment gate driver circuits described above may be used to implement gate driver circuits in first stage power converter 702 and second stage power converter 704.

Figure 7B:
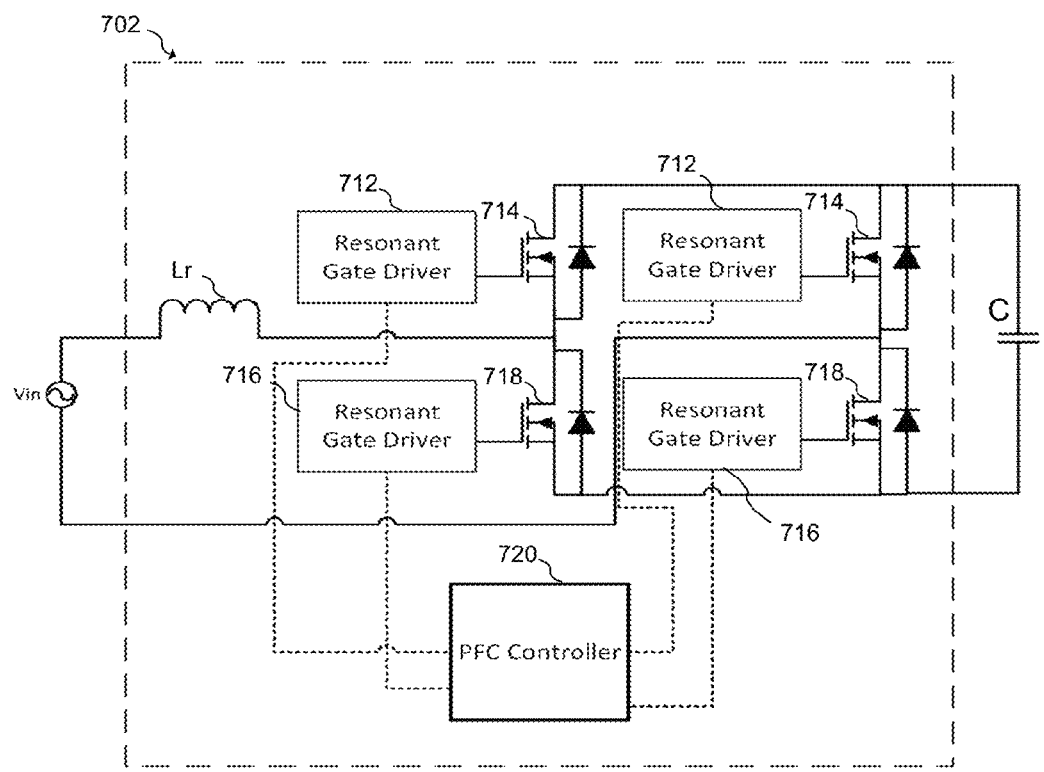

FIG. 7b illustrates an embodiment AC/DC power converter 702 that may be used to implement the first stage power converter 702 illustrated in FIG. 7a. As shown, power converter 702 includes a series inductor Lr followed by an H-bridge circuit that includes high-side transistors 714 and low-side transistors 718. Each of high-side transistors 714 is driven by an embodiment resonant high-side gate driver circuit 712, and each of low-side transistors 718 are driven by embodiment resonant low-side gate driver circuit 716 described in embodiments above. During operation, PFC controller 720 produces switching signals for high-side transistors 714 and for low-side transistors 718 such that the voltage across capacitor C is rectified. In some embodiments, PFC controller 720 controls the switching signals such that the AC input current is in phase with the AC input voltage. PFC controller 720 may be configured to activate high-side transistors 714 and low-side transistors 718 using soft-switching methods known in the art in order to reduce switching losses.

Figure 7C:
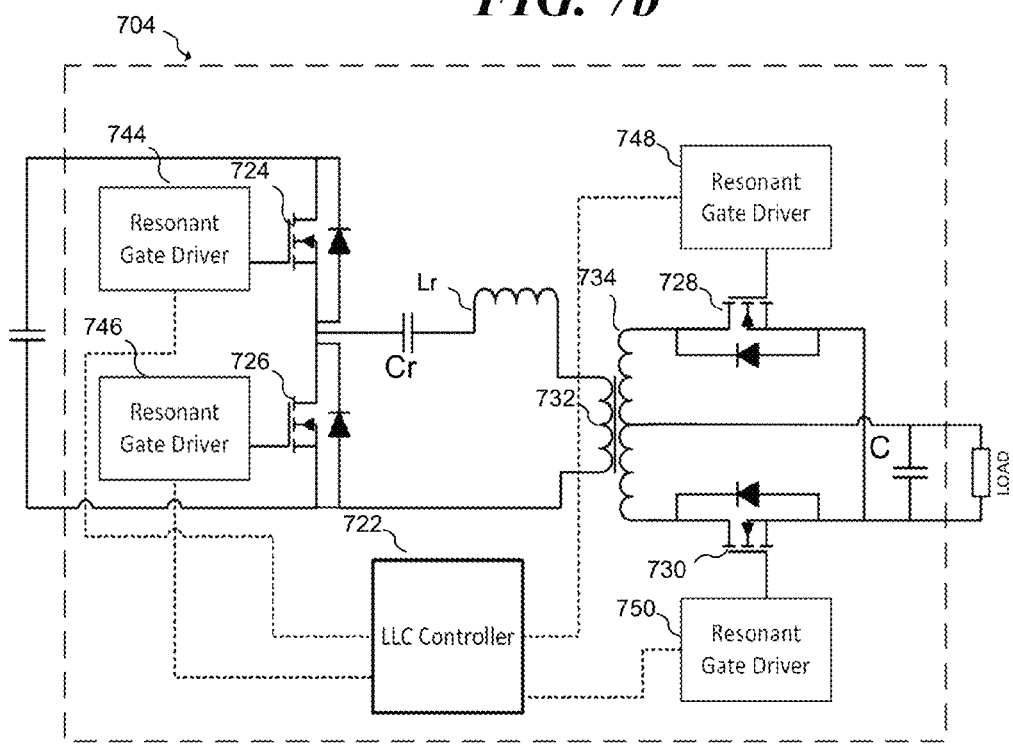

FIG. 7c illustrates an embodiment DC/DC power converter 704 that may be used to implement the second stage converter 704 illustrated in FIG. 7a. As shown, DC/DC power converter 704 is configured as an LLC converter having a half-bridge circuit with transistors 724 and 726 followed by a resonant capacitor Cr coupled in series with resonant inductor Lr and primary winding 732 of a transformer. On the secondary side, transistors 728 and 730 are coupled to the secondary winding 734 of the transformer. Each transistor 724, 726, 728 and 730 is driven by a corresponding embodiment resonant gate driver 744, 746, 748 and 750 as described in embodiments above.

During operation, LLC controller 722 produces switching signals that activate resonant gate drivers 744, 746, 748 and 750. In particular, LLC controller 722 drives half-bridge transistors 724 and 726 near a resonant frequency of power converter 702 to control the output voltage according to LLC control methodologies known in the art. LLC controller 722 further operates the secondary-side switching transistors 728 and 730 as synchronous rectifiers according to synchronous rectifier control schemes known in the art. In some embodiments, the various transistors are controlled using soft-switching methods known in the art. It should be appreciated that power converters 702 and 704 illustrated in FIGS. 7b and 7c are just two of many possible embodiment power converter topologies that may be used in embodiment power supply systems.

In some embodiments, the energy harvested from gate-drain capacitance CGD may be used to supplement the power used to drive the switching transistor. For example, in the embodiment fly back circuit of FIG. 1, an embodiment gate driver circuit may be used to drive the switching transistor such that at least 50% of the energy used to drive the switching transistor was harvested from the gate-drain capacitance of the switching transistor during a previous cycle. In some embodiments, the circuit may harvest other percentages of the power used to drive the switching transistor. This harvested power may even exceed the amount of power used to turn on the switching transistor.

Figure 8:
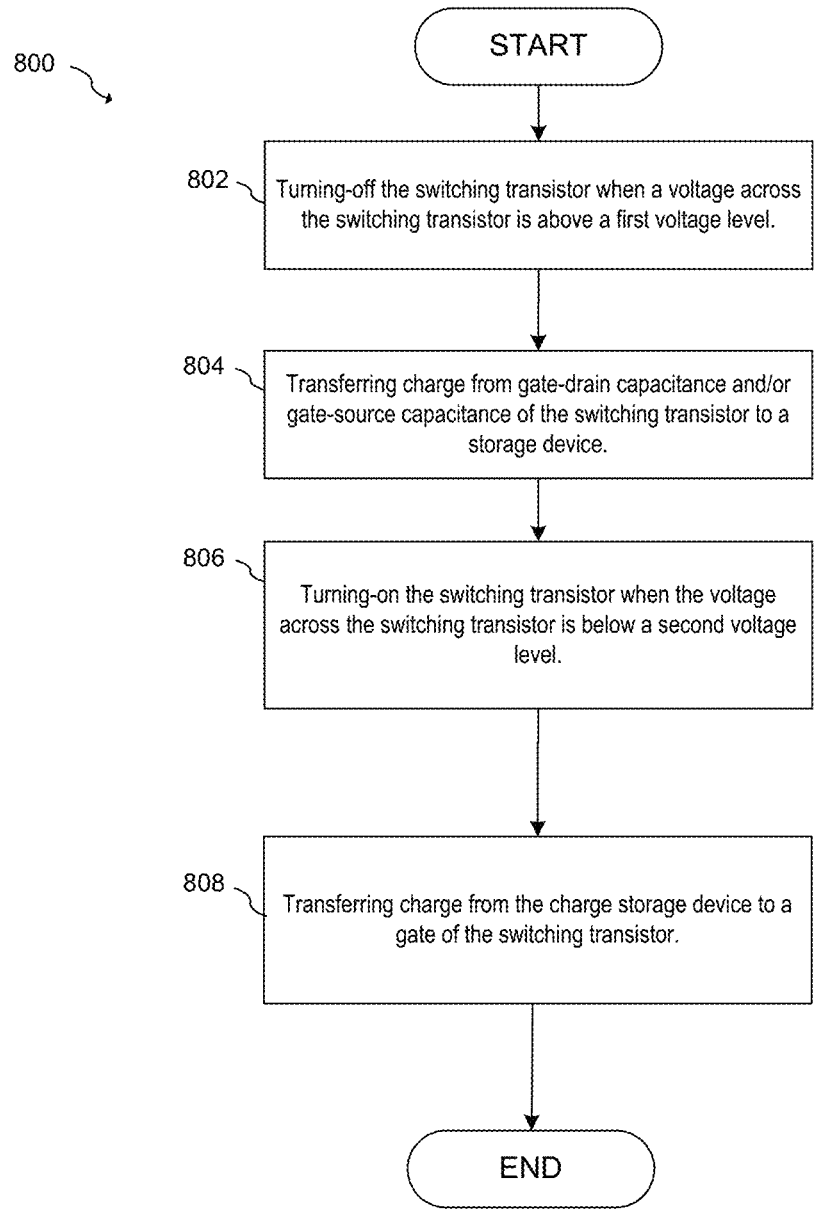
FIG. 8 illustrates a flow chart of an embodiment method.

FIG. 8 illustrates a flowchart of an embodiment method 800 of operating switching transistor. In step 802, a switching transistor is turned-off when a voltage across the switching transistor is above a first voltage level. In step 804, charge is transferred from gate-drain capacitance of the switching transistor to a charge storage device. In some embodiments, charge is also transferred from the gate-source capacitance of the switching transistor. Next in step 806, a switching transistor is turned-on when the voltage across the switching transistor is below a second voltage level, which is lower than the first voltage level. Finally, in step 808, the charge is transferred from the storage device to a gate of the switching transistor.

The general figure of merit (FOM) for a switching MOSFET is a product of Qgd*Ron, where Qgd is gate-drain charge and Ron is the on-resistance of the switching MOSET. In some embodiments of the present invention, however, larger Cgd translates into more energy being extracted from the gate-drain capacitance of the switching transistor when the switching transistor is being turned-off. Accordingly, in some embodiments, very good performance may be achieved even when Qgd*Ron are not minimized. The higher Qgd translates to higher energy extraction during MOSFET turn-off. Furthermore, with larger Qgd, the gate drive current waveform is may be different and allow charging and discharging of Cgd at highest current resonant point instead of classic miller capacitance current for conventional MOSFET. This may enable similar or even faster switching speeds while increasing Qgd or increasing Ron without sacrificing the switching speed or gate losses. Furthermore, a well-controlled resonant gate drive tends to have smooth switching waveforms without the conventional voltage overshoot seen in hard-switching gate drivers where the dv/dt of $V_{GS}$ can be finely controlled by the value of the resonant inductor Lr.

In various embodiments, energy can be extracted during turning-off of a switching transistor with a resonant inductor and a storage capacitor. The extracted energy is stored in the storage capacitor for re-use during turning-on of the switching transistor. A net positive energy is achieved when the energy extracted during turn-off is larger than the energy used to turn-on the switching transistor under ZVS condition including all switching and resistive losses. An equation is shown below to satisfy the condition for the net positive energy:

$$0.5 L_r I^2 - \text{Gate Drive Losses} > 0.5(C_{GS} + C_{GD}) V_{GS}^2 \qquad 2,$$

where $L_r$ is the resonant inductor, I is the maximum/peak current through the inductor during turn-off of the switching transistor, $V_{GS}$ is the gate-source voltage of the switching transistor during turn-on, $C_{GS}$ is the gate-source capacitor and $C_{GD}$ is the gate-drain capacitor of the switching transistor. The term $L_r I^2$ represents the energy transferred via the resonant inductor $L_r$ and stored in a storage capacitor or referred to as the extracted energy. The gate drive losses include switching and other resistive losses while driving the switching transistor. The right side of the equation denotes the energy required to turn-on the switching transistor under ZVS condition. The current I through the inductor can be expressed in terms of the capacitor $C_{GD}$, gate-source voltage $V_{GS}$ and gate-drain voltage $V_{DS}$ across the switching transistor. The equation may be further simplified by considering the gate drive losses as a fraction of the total energy extracted.

In an embodiment, using a switching MOSFET that has a $C_{GD}$ to $C_{GS}$ ratio of greater than 0.3 may yield a net positive energy when operated at a $V_{GS}$ of 10 V and a $V_{DS}$ of 50 V. In other embodiments, the ratio can be as low as 0.01 or as high as 1 to achieve net positive energy. It should be understood that above example is one of many ways to achieve net positive energy for different $C_{GS}$ to $C_{GD}$ ratio, $V_{GS}$, and $V_{DS}$ of the switching transistor.

Embodiments of the present invention may be applied to various switching applications. For example, embodiment gate drivers may be used in synchronous buck converters, AC and DC switched-mode power supplies, half-bridge and full-bridge drivers that are used, for example, in brushless DC motor drives. An advantage of some embodiments includes the ability to extract energy during resonant gate switching from the charging of gate-drain capacitor Cgd during transistor turn-off events and storing this energy for reuse. It is to be noted that during zero voltage switching, the gate driver does not need to charge gate-drain capacitor Cgd in the reverse direction, during turn-on event, and hence the stored energy is not supplied back. Therefore, the energy extracted during turn-off event contributes towards the efficiency of the system. In some embodiments, the energy extracted from charging of gate-drain capacitor Cgd and stored in a storage capacitor may be higher than the total energy consumption of the gate driver itself. In such cases, the power supply needed for the driver may be supplied by extracted energy. Embodiment systems and methods may also be applied to provide an autonomous power supply generator for the gate driver.

Embodiments of the present invention are summarized here. Other embodiments can also be understood from the entirety of the specification and the claims filed herein. One general aspect includes a method of operating a switching transistor that includes turning-off the switching transistor by transferring charge from a gate-drain capacitance of the switching transistor to a charge storage device, and turning-on the switching transistor by transferring charge from the charge storage device to a gate of the switching transistor. Turning-off the switching transistor includes hard-switching and turning-on the switching transistor includes soft-switching.

Implementations may include one or more of the following features. The method where transferring the charge from the gate-drain capacitance of the switching transistor to the charge storage device includes coupling an inductor between a reference node and the gate of the switching transistor, magnetizing the inductor with the charge from the gate-drain capacitance of the switching transistor, coupling the inductor between the gate of the switching transistor and the charge storage device a first time, and charging the charge storage device as the inductor demagnetizes; and transferring charge from the charge storage device to the gate of the switching transistor includes coupling the charge storage device to the gate of the switching transistor a second time. The method where coupling the inductor between the reference node and the gate of the switching transistor includes turning-on a first switch coupled between the inductor and the reference node; and coupling the charge storage device to the gate of the switching transistor the second time includes turning-on a second switch coupled between the inductor and the charge storage device. The method where the first switch includes a first transistor; the second switch includes a second transistor; and coupling the inductor between the gate of the switching transistor and the charge storage device the first time includes coupling the inductor to the charge storage device by at least one of turning-on the second transistor and using a body diode of the second transistor.

In some embodiments, coupling the inductor between the gate of the switching transistor and the charge storage device the first time further includes turning off the first switch and turning on a third switch coupled between the gate of the switching transistor and a reference terminal of the switching transistor. In some embodiments, the charge storage device includes a capacitor.

Implementations may further include the method where turning-off the switching transistor further includes transferring charge from a gate-source capacitance of the switching transistor to the charge storage device. The method where transferring charge from the gate-drain capacitance of the switching transistor to the charge storage device includes closing a switch coupled in series with an inductor and a capacitor of the charge storage device for a first time period; and transferring charge from the charge storage device to the gate of the switching transistor includes closing the switch for a second time period. In some embodiments, the first time period and the second time period may be one-half of a resonant time period of an LC tank formed by the inductor and an input capacitance of the switching transistor.

In some embodiments, the stored energy transferred from the switching transistor to the charge storage device is greater than 50% of energy transferred from the charge storage device to the gate of the switching transistor. In other embodiments, the stored energy transferred from the switching transistor to the charge storage device may be at least 100% of the energy transferred from the charge storage device to the gate of the switching transistor.

Implementations may further include the method where the switching transistor includes a high-side switching transistor. The method where the switching transistor includes a high-side switching transistor. In some embodiments, the switching transistor includes a super junction MOSFET. In other embodiments, the switching transistor includes a gallium nitride (GaN) high electron mobility transistor (HEMT).

The method may also include turning-off the switching transistor when a voltage across the switching transistor reaches a local maximum. In some embodiments, turning-on the switching transistor includes turning on the switching transistor when a voltage across the switching transistor reaches a local minimum and/or zero volts. In some embodiments, the method further includes monitoring a voltage of the charge storage device; and coupling the charge storage device to an external power supply when a voltage of the charge storage device falls below a predetermined threshold. The method may further include controlling a rate of change of a gate to source voltage of the switching transistor by adjusting an inductance of an inductor coupled to the gate of the switching transistor.

A further general aspect includes a circuit having a gate driver configured to be coupled to a gate of a switching transistor and to a charge storage device, where the gate driver configured to: turn-off the switching transistor by transferring charge from a gate-drain capacitance of the switching transistor to a charge storage device, where the switching transistor is turned-off using hard switching; and turn-on the switching transistor by transferring charge from the charge storage device to a gate of the switching transistor. The switching transistor is turned-on using hard switching.

Implementations may include one or more of the following features. The circuit where: the gate driver includes an inductor configured to be coupled to the gate of the switching transistor; and the gate driver is further configured to transfer charge from the gate-drain capacitance of the switching transistor to the charge storage device by coupling the inductor between a reference node and the gate of the switching transistor, magnetizing the inductor with the charge from the gate-drain capacitance of the switching transistor, coupling the inductor between the gate of the switching transistor and the charge storage device a first time, and charging the charge storage device as the inductor demagnetizes, and transfer charge from the charge storage device to the gate of the switching transistor by coupling the charge storage device to the gate of the switching transistor a second time. The circuit where the gate driver further includes: a first switch coupled between the inductor and the reference node; and a second switch coupled between the inductor and the charge storage device, where the gate driver is configured to couple the inductor between the reference node and the gate of the switching transistor by turning on the first switch, and couple the charge storage device to the gate of the switching transistor the second time by turning on the second switch.

Implementations may further include the circuit where the first switch has a first transistor; the second switch has a second transistor; and the gate driver is configured to couple the inductor between the gate of the switching transistor and the charge storage device the first time via a body diode of the second transistor. The circuit where the gate driver includes: an inductor and a switch coupled in series forming a switched inductor circuit, the switched inductor circuit configured to be coupled between the charge storage device and the gate of the switching transistor, where the gate driver circuit is further configured to transfer charge from a gate-drain capacitance of the switching transistor to the charge storage device by closing the switch for a first time period, and transfer charge from the charge storage device to the gate of the switching transistor by closing the switch for a second time period.

In some embodiments, the first time period and the second time period are one-half of a resonant time period of an LC tank formed by the inductor and an input capacitance of the switching transistor. In some embodiments the charge storage device includes a capacitor. Stored energy transferred from the gate of the switching transistor to the charge storage device may be greater than 50% of energy transferred from the charge storage device to the gate of the switching transistor. In some cases, stored energy transferred from the gate of the switching transistor to the charge storage device is at least 100% of energy transferred from the charge storage device to the gate of the switching transistor.

Implementations may also include the circuit where the gate-drain capacitance of the switching transistor is at least one-tenth of a gate-source capacitance of the switching transistor. In some embodiments, the circuit includes the switching transistor. The switching transistor may include a high-side switching transistor, and, in some embodiments, the switching transistor includes a super junction MOSFET. The gate driver may be configured to turn-on the switching transistor when a voltage across the switching transistor is zero volts.

In various embodiments, circuit further includes a charge storage monitoring circuit configured to monitor a voltage of the charge storage circuit; and a switch coupled between the charge storage device and an external power supply, where the charge monitoring circuit is configured to close the switch when a voltage of the charge storage device falls below a predetermined threshold. The charge storage monitoring circuit may include a comparator having a first input node coupled to the charge storage device, a second input node coupled to a reference voltage node, and an output coupled to a control node of the switch. In some embodiments, the circuit further includes the charge storage device.

In an embodiment, the circuit includes: the switching transistor; a transformer having a first winding coupled to the switching transistor; a secondary side circuit including a secondary controller coupled to secondary-side switching that are coupled to a second winding of the transformer; and an isolated communications link coupled between the secondary controller and an input to the gate driver, where stored energy transferred from the charge storage device to the switching transistor is greater than 50% of energy transferred from the charge storage device to the gate of the switching transistor.

A further general aspect includes a method of driving a first switching transistor and a second switching transistor, the method including: turning-off the first switching transistor including transferring a charge from a gate of the first switching transistor to a charge storage device; after turning-off the first switching transistor, turning-on the second switching transistor including transferring the charge from the charge storage device to a gate of the second switching transistor; after turning-on the second switching transistor, turning-off the second switching transistor including transferring the charge from the gate of the second switching transistor to the charge storage device; and after turning-off the second switching transistor, turning-on the first switching transistor including transferring the charge from the charge storage device to the gate of the first switching transistor.

Implementations may include one or more of the following features. The method where turning-off the first switching transistor includes turning-off the first switching transistor when a voltage across the first switching transistor is greater than a first voltage level; turning-off the second switching transistor includes turning-off the second switching transistor when a voltage across the second switching transistor is greater than the first voltage level; turning-on the first switching transistor includes turning-on the first switching transistor when the voltage across the first switching transistor is less than a second voltage level, where the second voltage level is less than the first voltage level; and turning-on the second switching transistor includes turning-on the second switching transistor when the voltage across the second switching transistor is less than the second voltage level. In some embodiments, turning-on the second switching transistor includes using at least 50% of energy taken from the gate of the first switching transistor while turning-off the first switching transistor.

In an embodiment, transferring the charge from the gate of the first switching transistor to the charge storage device includes charging a first capacitor via an inductor; transferring the charge from the gate of the second transistor to the charge storage device includes charging a second capacitor via the inductor; transferring the charge from the charge storage device to the gate of the first transistor includes transferring the charge from the second capacitor to the first capacitor via the inductor and transferring the charge from the first capacitor to the gate of the first transistor via the inductor; and transferring the charge from the charge storage device to the gate of the second transistor includes transferring the charge from the first capacitor to the second capacitor via the inductor and transferring the charge from the second capacitor to the gate of the second transistor via the inductor.

Implementations further include the method where: transferring the charge from the gate of the first switching transistor to the charge storage device includes charging a first capacitor via an inductor by closing a first switch coupled between the gate of the first switching transistor and a first terminal of the inductor, closing a second switch coupled between a second terminal of the inductor and a reference node, opening a third switch coupled between the second terminal of the inductor and the gate of the second switching transistor, and opening a fourth switch coupled between the first terminal of the inductor and the reference node; transferring the charge from the gate of the second transistor to the charge storage device includes charging a second capacitor via the inductor by opening the first switch, opening the second switch, closing the third switch and closing the fourth switch; transferring the charge from the charge storage device to the gate of the first transistor includes transferring the charge from the second capacitor to the first capacitor via the inductor by opening the first switch, closing the second switch, opening the third switch and closing the fourth switch, and transferring the charge from the first capacitor to the gate of the first transistor via the inductor by closing the first switch, closing the second switch, opening the third switch and opening the fourth switch; and transferring the charge from the charge storage device to the gate of the second transistor includes transferring the charge from the first capacitor to the second capacitor via the inductor by opening the first switch, closing the second switch, opening the third switch and closing the fourth switch, and transferring the charge from the second capacitor to the gate of the second transistor via the inductor by opening the first switch, opening the second switch, closing the third switch and closing the fourth switch.

In an embodiment, the steps of closing the first switch, closing the second switch, closing the third switch and closing the fourth switch includes closing the respective switches for a half-resonant cycle of an LC tank formed by the inductor, the first capacitor and the second capacitor.

One general aspect includes a power supply system including: a switching transistor circuit configured to drive an inductive load; a charge storage capacitor coupled to a gate of the switching transistor; a gate driver circuit configured to turn-off the switching transistor, transfer a first energy from the switching transistor to the charge storage capacitor when turning-off the switching transistor; and turn-on the switching transistor by transferring a second energy from the charge storage capacitor to the gate of the switching transistor, where the first energy is at least 50% of the second energy.

Implementations may include one or more of the following features. The system where the switching transistor circuit includes a gallium nitride (GaN) high electron mobility transistor (HEMT). In some embodiments, the first energy is at least 100% of the second energy. The gate driver may be configured to turn-off the switching transistor using hard switching; and the gate driver is configured to turn-on the switching transistor using soft-switching.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a switching transistor, the method comprising:
    turning-off the switching transistor, turning-off the switching transistor comprising transferring charge from a gate-drain capacitance of the switching transistor to a charge storage device, wherein turning-off the switching transistor comprises hard-switching; and
    turning-on the switching transistor, turning-on the switching transistor comprising transferring charge from the charge storage device to a gate of the switching transistor, wherein turning-on the switching transistor comprises soft-switching.

2. The method of claim 1, wherein:
    transferring the charge from the gate-drain capacitance of the switching transistor to the charge storage device comprises coupling an inductor between a reference node and the gate of the switching transistor, magnetizing the inductor with the charge from the gate-drain capacitance of the switching transistor, coupling the inductor between the gate of the switching transistor and the charge storage device a first time, and charging the charge storage device as the inductor demagnetizes; and
    transferring charge from the charge storage device to the gate of the switching transistor comprises coupling the charge storage device to the gate of the switching transistor a second time.

3. The method of claim 2, wherein:
    coupling the inductor between the reference node and the gate of the switching transistor comprises turning-on a first switch coupled between the inductor and the reference node; and coupling the charge storage device to the gate of the switching transistor the second time comprises turning-on a second switch coupled between the inductor and the charge storage device.

4. The method of claim 3, wherein:
the first switch comprises a first transistor;
the second switch comprises a second transistor; and
coupling the inductor between the gate of the switching transistor and the charge storage device the first time comprises coupling the inductor to the charge storage device by at least one of turning-on the second transistor and using a body diode of the second transistor.

5. The method of claim 3, wherein coupling the inductor between the gate of the switching transistor and the charge storage device the first time further comprises turning off the first switch and turning on a third switch coupled between the gate of the switching transistor and a reference terminal of the switching transistor.

6. The method of claim 1, wherein the charge storage device comprises a capacitor.

7. The method of claim 1, wherein turning-off the switching transistor further comprises transferring charge from a gate-source capacitance of the switching transistor to the charge storage device.

8. The method of claim 1, wherein:
transferring charge from the gate-drain capacitance of the switching transistor to the charge storage device comprises closing a switch coupled in series with an inductor and a capacitor of the charge storage device for a first time period; and
transferring charge from the charge storage device to the gate of the switching transistor comprises closing the switch for a second time period.

9. The method of claim 8, wherein the first time period and the second time period are one-half of a resonant time period of an LC tank formed by the inductor and an input capacitance of the switching transistor.

10. The method of claim 1, wherein stored energy transferred from the switching transistor to the charge storage device is greater than 50% of energy transferred from the charge storage device to the gate of the switching transistor.

11. The method of claim 10, wherein the stored energy transferred from the switching transistor to the charge storage device is at least 100% of the energy transferred from the charge storage device to the gate of the switching transistor.

12. The method of claim 1, wherein the switching transistor comprises a high-side switching transistor.

13. The method of claim 1, wherein the switching transistor comprises a super junction MOSFET.

14. The method claim 1, wherein the switching transistor comprises a gallium nitride (GaN) high electron mobility transistor (HEMT).

15. The method of claim 1, wherein turning-off the switching transistor when a voltage across the switching transistor reaches a local maximum.

16. The method of claim 1, wherein turning-on the switching transistor comprises turning on the switching transistor when a voltage across the switching transistor reaches a local minimum.

17. The method of claim 1, wherein turning-on the switching transistor comprises turning-on the switching transistor when a voltage across the switching transistor reaches zero volts.

18. The method of claim 1, further comprising:
monitoring a voltage of the charge storage device; and
coupling the charge storage device to an external power supply when a voltage of the charge storage device falls below a predetermined threshold.

19. The method of claim 1, further comprising controlling a rate of change of a gate to source voltage of the switching transistor by adjusting an inductance of an inductor coupled to the gate of the switching transistor.

20. A circuit comprising:
a gate driver configured to be coupled to a gate of a switching transistor and to a charge storage device, the gate driver configured to:
turn-off the switching transistor by transferring charge from a gate-drain capacitance of the switching transistor to a charge storage device, wherein the switching transistor is turned-off using hard switching; and
turn-on the switching transistor by transferring charge from the charge storage device to a gate of the switching transistor, wherein the switching transistor is turned-on using soft switching.

21. The circuit of claim 20, wherein:
the gate driver comprises an inductor configured to be coupled to the gate of the switching transistor; and
the gate driver is further configured to
transfer charge from the gate-drain capacitance of the switching transistor to the charge storage device by coupling the inductor between a reference node and the gate of the switching transistor, magnetizing the inductor with the charge from the gate-drain capacitance of the switching transistor, coupling the inductor between the gate of the switching transistor and the charge storage device a first time, and charging the charge storage device as the inductor demagnetizes, and
transfer charge from the charge storage device to the gate of the switching transistor by coupling the charge storage device to the gate of the switching transistor a second time.

22. The circuit of claim 21, wherein the gate driver further comprises:
a first switch coupled between the inductor and the reference node; and
a second switch coupled between the inductor and the charge storage device, wherein the gate driver is configured to
couple the inductor between the reference node and the gate of the switching transistor by turning on the first switch, and
couple the charge storage device to the gate of the switching transistor the second time by turning on the second switch.

23. The circuit of claim 22, wherein:
the first switch comprises a first transistor;
the second switch comprises a second transistor; and
the gate driver is configured to couple the inductor between the gate of the switching transistor and the charge storage device the first time via a body diode of the second transistor.

24. The circuit of claim 21, wherein the gate driver comprises:
an inductor and a switch coupled in series forming a switched inductor circuit, the switched inductor circuit configured to be coupled between the charge storage device and the gate of the switching transistor, wherein the gate driver is further configured to
transfer charge from a gate-drain capacitance of the switching transistor to the charge storage device by closing the switch for a first time period, and transfer charge from the charge storage device to the gate of the switching transistor by closing the switch for a second time period.

25. The circuit of claim 24, wherein the first time period and the second time period are one-half of a resonant time period of an LC tank formed by the inductor and an input capacitance of the switching transistor.

26. The circuit of claim 20, wherein the charge storage device comprises a capacitor.

27. The circuit of claim 20, wherein stored energy transferred from the gate of the switching transistor to the charge storage device is greater than 50% of energy transferred from the charge storage device to the gate of the switching transistor.

28. The circuit of claim 27, wherein stored energy transferred from the gate of the switching transistor to the charge storage device is at least 100% of energy transferred from the charge storage device to the gate of the switching transistor.

29. The circuit of claim 20, wherein the gate-drain capacitance of the switching transistor is at least one-tenth of a gate-source capacitance of the switching transistor.

30. The circuit of claim 20, further comprising the switching transistor.

31. The circuit of claim 30, wherein the switching transistor comprises a high-side switching transistor.

32. The circuit of claim 30, wherein switching transistor comprises a super junction MOSFET.

33. The circuit of claim 20, wherein the gate driver is configured to turn-on the switching transistor when a voltage across the switching transistor is zero volts.

34. The circuit of claim 20, further comprising
a charge storage monitoring circuit configured to monitor a voltage of the charge storage device; and
a switch coupled between the charge storage device and an external power supply, wherein the charge storage monitoring circuit is configured to close the switch when a voltage of the charge storage device falls below a predetermined threshold.

35. The circuit of claim 34, wherein the charge storage monitoring circuit comprises a comparator having a first input node coupled to the charge storage device, a second input node coupled to a reference voltage node, and an output node coupled to a control node of the switch.

36. The circuit of claim 20, further comprising the charge storage device.

37. The circuit of claim 20, further comprising:
the switching transistor;
a transformer having a first winding coupled to the switching transistor;
a secondary side circuit comprising a secondary controller coupled to secondary-side switching that are coupled to a second winding of the transformer; and
an isolated communications link coupled between the secondary controller and an input to the gate driver, wherein stored energy transferred from the charge storage device to the switching transistor is greater than 50% of energy transferred from the charge storage device to the gate of the switching transistor.

38. A method of driving a first switching transistor and a second switching transistor, the method comprising:
turning-off the first switching transistor comprising transferring a charge from a gate of the first switching transistor to a charge storage device;
after turning-off the first switching transistor, turning-on the second switching transistor comprising transferring the charge from the charge storage device to a gate of the second switching transistor;
after turning-on the second switching transistor, turning-off the second switching transistor comprising transferring the charge from the gate of the second switching transistor to the charge storage device; and
after turning-off the second switching transistor, turning-on the first switching transistor comprising transferring the charge from the charge storage device to the gate of the first switching transistor.

39. The method of claim 38, wherein
turning-off the first switching transistor comprises turning-off the first switching transistor when a voltage across the first switching transistor is greater than a first voltage level;
turning-off the second switching transistor comprises turning-off the second switching transistor when a voltage across the second switching transistor is greater than the first voltage level;
turning-on the first switching transistor comprises turning-on the first switching transistor when the voltage across the first switching transistor is less than a second voltage level, wherein the second voltage level is less than the first voltage level; and
turning-on the second switching transistor comprises turning-on the second switching transistor when the voltage across the second switching transistor is less than the second voltage level.

40. The method of claim 38, wherein turning-on the second switching transistor comprises using at least 50% of energy taken from the gate of the first switching transistor while turning-off the first switching transistor.

41. The method of claim 38, wherein
transferring the charge from the gate of the first switching transistor to the charge storage device comprises charging a first capacitor via an inductor;
transferring the charge from the gate of the second switching transistor to the charge storage device comprises charging a second capacitor via the inductor;
transferring the charge from the charge storage device to the gate of the first switching transistor comprises transferring the charge from the second capacitor to the first capacitor via the inductor and transferring the charge from the first capacitor to the gate of the first switching transistor via the inductor; and
transferring the charge from the charge storage device to the gate of the second switching transistor comprises transferring the charge from the first capacitor to the second capacitor via the inductor and transferring the charge from the second capacitor to the gate of the second switching transistor via the inductor.

42. The method of claim 38, wherein:
transferring the charge from the gate of the first switching transistor to the charge storage device comprises charging a first capacitor via an inductor by
closing a first switch coupled between the gate of the first switching transistor and a first terminal of the inductor, closing a second switch coupled between a second terminal of the inductor and a reference node, opening a third switch coupled between the second terminal of the inductor and the gate of the second switching transistor, and opening a fourth switch coupled between the first terminal of the inductor and the reference node;
transferring the charge from the gate of the second switching transistor to the charge storage device comprises charging a second capacitor via the inductor by opening the first switch, opening the second switch, closing the third switch and closing the fourth switch;
transferring the charge from the charge storage device to the gate of the first switching transistor comprises
transferring the charge from the second capacitor to the first capacitor via the inductor by opening the first switch, closing the second switch, opening the third switch and closing the fourth switch, and
transferring the charge from the first capacitor to the gate of the first switching transistor via the inductor by closing the first switch, closing the second switch, opening the third switch and opening the fourth switch; and
transferring the charge from the charge storage device to the gate of the second switching transistor comprises
transferring the charge from the first capacitor to the second capacitor via the inductor by opening the first switch, closing the second switch, opening the third switch and closing the fourth switch, and
transferring the charge from the second capacitor to the gate of the second switching transistor via the inductor by opening the first switch, opening the second switch, closing the third switch and closing the fourth switch.

43. The method of claim 42, wherein the steps of closing the first switch, closing the second switch, closing the third switch and closing the fourth switch comprises closing the respective switches for a half-resonant cycle of an LC tank formed by the inductor, the first capacitor and the second capacitor.

44. A power supply system comprising:
a switching transistor configured to drive an inductive load;
a charge storage capacitor conductively coupled to a gate of the switching transistor;
a gate driver circuit configured to
turn-off the switching transistor,
transfer a first energy from the switching transistor to the charge storage capacitor when turning-off the switching transistor; and
turn-on the switching transistor by transferring a second energy from the charge storage capacitor to the gate of the switching transistor, wherein the first energy is at least 50% of the second energy.

45. The system of claim 44, wherein the switching transistor comprises a gallium nitride (GaN) high electron mobility transistor (HEMT).

46. The system of claim 44, wherein the first energy is at least 100% of the second energy.

47. The system of claim 44, wherein:
the gate driver circuit is configured to turn-off the switching transistor using hard switching; and
the gate driver circuit is configured to turn-on the switching transistor using soft-switching.

48. The system of claim 44, wherein the gate driver circuit comprises an inductor coupled between the charge storage capacitor and the gate of the switching transistor.

49. The system of claim 48, wherein:
the gate driver circuit is configured to transfer the first energy from the switching transistor to the charge storage capacitor via the inductor; and
the gate driver circuit is configured to transfer the second energy from the charge storage capacitor to the gate of the switching transistor.

50. The method of claim 1, wherein transferring the charge from a gate-drain capacitance of the switching transistor to the charge storage device and transferring the charge from a gate-drain capacitance of the switching transistor to a charge storage device comprises transferring the charge through an inductor.

51. The circuit of claim 20, wherein the gate driver comprises an inductor coupled between the gate of the switching transistor and the charge storage device.

52. The circuit of claim 51, wherein the gate driver is configured to:
turn-off the switching transistor by transferring charge from the gate-drain capacitance of the switching transistor to the charge storage device through the inductor; and
turn-on the switching transistor by transferring charge from the charge storage device to the gate of the switching transistor through the inductor.

53. The method of claim 38, wherein:
transferring the charge from the gate of the first switching transistor to the charge storage device comprises charging the charge storage device via an inductor; and
transferring the charge from the gate of the second switching transistor to the charge storage device comprises charging the charge storage device via the inductor.

* * * * *